(12) United States Patent
Komiyaji et al.

(10) Patent No.: US 11,804,391 B2
(45) Date of Patent: Oct. 31, 2023

(54) TRANSFER SYSTEM, TRANSFER METHOD, AND TRANSFER APPARATUS

(71) Applicant: KABUSHIKI KAISHA YASKAWA DENKI, Fukuoka (JP)

(72) Inventors: Osamu Komiyaji, Fukuoka (JP); Hiromitsu Akae, Fukuoka (JP); Go Yamaguchi, Fukuoka (JP); Tadataka Noguchi, Fukuoka (JP)

(73) Assignee: KABUSHIKI KAISHA YASKAWA DENKI, Fukuoka (JP)

( * ) Notice: Subject to any disclaimer, the term of this patent is extended or adjusted under 35 U.S.C. 154(b) by 0 days.

(21) Appl. No.: 17/840,697

(22) Filed: Jun. 15, 2022

(65) Prior Publication Data

US 2022/0310423 A1  Sep. 29, 2022

Related U.S. Application Data

(63) Continuation of application No. 17/117,869, filed on Dec. 10, 2020, now Pat. No. 11,417,550, which is a
(Continued)

(51) Int. Cl.
| | |
|---|---|
| *H01L 21/67* | (2006.01) |
| *H01L 21/677* | (2006.01) |
| *H01L 21/687* | (2006.01) |

(52) U.S. Cl.
CPC .... *H01L 21/67196* (2013.01); *H01L 21/6773* (2013.01); *H01L 21/67167* (2013.01); *H01L 21/67748* (2013.01); *H01L 21/68707* (2013.01)

(58) Field of Classification Search
CPC ......... H01L 21/67196; H01L 21/67167; H01L 21/6773; H01L 21/67748; H01L 21/68707
See application file for complete search history.

(56) References Cited

U.S. PATENT DOCUMENTS

| | | | | | |
|---|---|---|---|---|---|
| 5,234,303 | A | * | 8/1993 | Koyano | ............ H01L 21/67742 414/217 |
| 2008/0145191 | A1 | * | 6/2008 | Salinas | ............. H01L 21/67109 414/217 |

(Continued)

FOREIGN PATENT DOCUMENTS

| | | |
|---|---|---|
| JP | 2003-197709 A | 7/2003 |
| JP | 2008-028179 A | 2/2008 |

(Continued)

OTHER PUBLICATIONS

Extended European Search Report dated Dec. 21, 2022 for EP 20918047.0 (European counterpart of this application) (9 pages).

*Primary Examiner* — Glenn F Myers
(74) *Attorney, Agent, or Firm* — Venjuris, P.C.

(57) ABSTRACT

A transfer system includes: a transfer chamber having a side wall provided thereon with a plurality of processing chambers in which a processing is performed on a substrate under a decompressed atmosphere, and configured such that the substrate is transferred in the decompressed atmosphere; a plurality of robots fixed in the transfer chamber and configured to transfer the substrate; and a movable buffer configured to hold the substrate and move in a horizontal direction along the side wall between the side wall and the robots in the transfer chamber. The robots exchange the substrate between the movable buffer and the processing chambers in cooperation with a movement of the movable buffer.

18 Claims, 17 Drawing Sheets

Related U.S. Application Data continuation-in-part of application No. PCT/JP2020/004431, filed on Feb. 5, 2020.

(56) References Cited

U.S. PATENT DOCUMENTS

| | | | |
|---|---|---|---|
| 2009/0198377 A1* | 8/2009 | Adachi | H01L 21/67742 700/250 |
| 2009/0213347 A1* | 8/2009 | Sugihara | G03F 7/70741 414/800 |
| 2011/0130864 A1* | 6/2011 | Hirota | H01L 21/68707 901/3 |
| 2013/0302115 A1 | 11/2013 | Wakabayashi et al. | |
| 2014/0234057 A1 | 8/2014 | Newman | |
| 2017/0110354 A1 | 4/2017 | Daugherty et al. | |
| 2018/0308735 A1 | 10/2018 | Janakiraman et al. | |
| 2020/0122316 A1 | 4/2020 | Tsang et al. | |

FOREIGN PATENT DOCUMENTS

| | | |
|---|---|---|
| KR | 10-0805397 B1 | 2/2008 |
| WO | 2019/161169 A | 8/2019 |

\* cited by examiner

US 11,804,391 B2

TRANSFER SYSTEM, TRANSFER METHOD, AND TRANSFER APPARATUS

CROSS-REFERENCE TO RELATED APPLICATIONS

This application is a continuation application of U.S. application Ser. No. 17/117,869, filed on Dec. 10, 2020, which is a continuation-in-part application of International Patent Application No. PCT/JP2020/004431 filed on Feb. 5, 2020, all of which are incorporated herein in their entireties by reference.

TECHNICAL FIELD

The present disclosure relates to a transfer system, a transfer method, and a transfer apparatus.

BACKGROUND

In the related art, a transfer system is known in which a robot with a hand for holding a substrate is disposed inside a transfer chamber which is brought into a decompressed atmosphere transferring a substrate to/from a processing chamber provided on the side wall of the transfer chamber. For example, a substrate processing apparatus has been proposed in which a movable robot configured to move in a transfer chamber by being driven by a linear motor transfers a substrate to/from a plurality of processing chambers provided on the side wall of the transfer chamber (e.g., Japanese Laid-Open Patent Application Publication No. 2008-028179).

SUMMARY

According to an aspect of the present disclosure, a transfer system includes: a transfer chamber having a side wall provided thereon with a plurality of processing chambers in which a processing is performed on a substrate under a decompressed atmosphere, and configured such that the substrate is transferred under the decompressed atmosphere; a plurality of robots fixed in the transfer chamber and configured to transfer the substrate; and a movable buffer configured to hold the substrate and move in a horizontal direction along the side wall between the side wall and the robots in the transfer chamber. The robots exchange the substrate between the movable buffer and the processing chambers in cooperation with a movement of the movable buffer.

According to another aspect of the present disclosure, a transfer method includes: providing a transfer chamber having a side wall provided thereon with a plurality of processing chambers in which a processing is performed on a substrate under a decompressed atmosphere, and configured such that the substrate is transferred under the decompressed atmosphere, a plurality of robots fixed in the transfer chamber and configured to transfer the substrate, and a movable buffer configured to hold the substrate and move in a horizontal direction along the side wall between the side wall and the robots in the transfer chamber; and operating the robots in cooperation with a movement of the movable buffer, to exchange the substrate between the movable buffer and the processing chambers.

According to yet another aspect of the present disclosure, a transfer apparatus includes: a plurality of robots fixed in a transfer chamber and configured to transfer a substrate, the transfer chamber having a side wall provided thereon with a plurality of processing chambers in which a processing is performed on the substrate under a decompressed atmosphere, and configured such that the substrate is transferred under the decompressed atmosphere; a movable buffer configured to hold the substrate and move in a horizontal direction along the side wall between the side wall and the robots in the transfer chamber; and a controller configured to operate the robots in cooperation with a movement of the movable buffer to exchange the substrate between the movable buffer and the processing chambers.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented herein.

In the related art described above, there is a concern that adopting the movable robot may increase costs, or the complicated movement mechanism may deteriorate the availability. Since the deterioration of availability results in the decrease in transfer efficiency of a substrate, an improvement is necessary from the viewpoint of increasing the transfer efficiency of an unprocessed substrate and a processed substrate.

An aspect of embodiments relates to providing a transfer system, a transfer method, and a transfer apparatus which are capable of improving the transfer efficiency of a substrate.

Hereinafter, embodiments of the transfer system, the transfer method, and the transfer apparatus according to the present disclosure will be described in detail with reference to the accompanying drawings. The present disclosure is not limited to the embodiments described herein below.

In the embodiments described herein below, terms such as "perpendicular," "horizontal," "vertical," "parallel," and "symmetrical" will be used, and these terms do not strictly require to satisfy the states thereof. That is, the terms allow deviations in, for example, manufacturing accuracy, installation accuracy, process accuracy, and detection accuracy.

Figure 1:
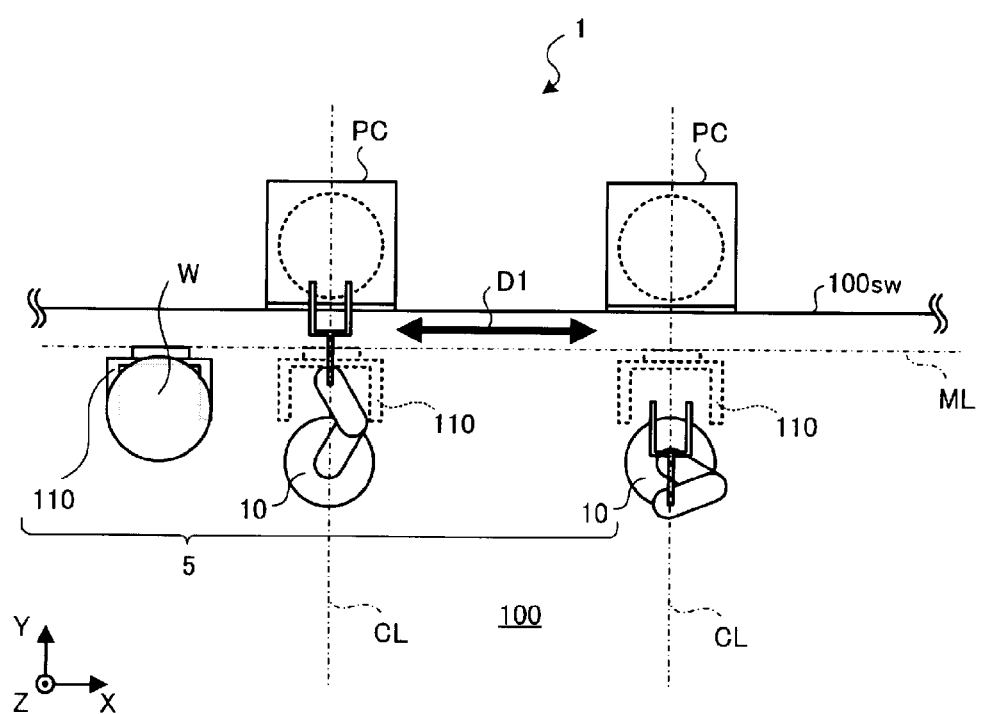
FIG. 1 is a schematic top view illustrating an outline of a transfer system according to an embodiment.

First, the outline of a transfer system 1 according to an embodiment will be described using FIG. 1. FIG. 1 is a schematic top view illustrating the outline of the transfer system 1 according to the embodiment. FIG. 1 corresponds to a schematic view of the transfer system 1 when viewed from above.

In order to facilitate the understanding of descriptions, FIG. 1 represents a three-dimensional orthogonal coordinate system in which the vertical upward direction corresponds to the positive direction of the Z axis, the X axis corresponds to a direction along the side wall 100sw of a transfer chamber 100 with a plurality of processing chambers PC provided thereon, and the Y axis corresponds to a direction of the normal lines of the side wall 100sw. The orthogonal coordinate system may also be illustrated in the other drawings to be referred-to throughout the descriptions. Further, FIG. 1 illustrates a line CL that corresponds to the front of a processing chamber PC. The line CL corresponds to a line (e.g., a line along the Y axis in FIG. 1) that passes through the center of a substrate W in the processing chamber PC (see the dashed-line circle), among the normal lines of the side wall 100sw.

As illustrated in FIG. 1, the plurality of processing chambers PC are provided on the side wall 100sw outside the transfer chamber 100, to each perform a processing on the substrate W under a decompressed atmosphere. Here, the processing performed on the substrate W in each processing chamber PC is, for example, a film formation processing such as a CVD (chemical vapor deposition) or an etching. In general, the environment of decompressed atmosphere may be called a "vacuum" state. In the processing chamber PC illustrated in FIG. 1, the double-line side corresponds to an opening which is openable/closable.

The transfer chamber 100 has a decompressed atmosphere therein similar to the transfer chamber 100, and a plurality of robots 10 and a movable buffer 110 are arranged inside the transfer chamber 100 such that both the robots 10 and the movable buffer 110 transfer the substrate W in cooperation with each other. Each robot 10 is a substrate transfer mechanism that performs a transfer of the substrate W such as carrying the substrate W into the processing chamber PC or taking the substrate W out of the processing chamber PC, and is, for example, a horizontal multi-joint robot (SCARA robot).

Here, the robot 10 is a "fixed robot" that is fixed to, for example, the floor 100f of the transfer chamber 100 (see, e.g., FIG. 4), and is distinguishable from a "movable robot" that travels or moves in the transfer chamber 100. Since the robot 10 does not move in the transfer chamber 100, power may be easily fed to the robot 10, and the cleanliness of the transfer chamber 100 may be implemented.

The movable buffer 110 temporarily holds the substrate W, and moves in a horizontal direction D along the side wall 100sw between the side wall 100sw and the robots 10. For example, the movable buffer 110 is driven in a non-contact manner by a linear motor or the like. FIG. 1 illustrates a movement path ML of the movable buffer 110 for reference. Here, since the side wall 100sw illustrated in FIG. 1 is linear in the top view, the horizontal direction D1 or the movement path ML is linear. However, when the side wall 100sw is curved in the top view, the horizontal direction D1 or the movement path ML may also be curved along the side wall 100sw.

The robot 10 performs the exchange of the substrate W between the movable buffer 110 and the processing chamber PC in cooperation with the movement of the movable buffer 110. Specifically, in a case where the robot 10 carries the substrate W into the processing chamber PC, the movable buffer 110 that is holding an unprocessed substrate W moves to the vicinity of the robot 10. The robot 10 acquires the unprocessed substrate W from the movable buffer 110, and carries the acquired unprocessed substrate W into the processing chamber PC.

Further, in a case where the robot 10 takes the substrate W out of the processing chamber PC, the movable buffer 110 in an empty state (which is holding no substrate W) moves to the vicinity of the robot 10. The robot 10 takes the processed substrate W out of the processing chamber PC, and delivers the taken processed substrate W to the movable buffer 110.

As illustrated in FIG. 1, when the plurality of robots 10 are arranged in front of the processing chambers PC, respectively, the movable buffer 110 may also stop in front of each processing chamber PC (e.g., the movable buffer 110 indicated in the dashed line in FIG. 1). As a result, the moving distance of the substrate W may be minimized when the robot 10 takes the substrate W into/out of the processing chamber PC, so that the transfer efficiency may be improved. Further, since the operation of the robot 10 may be simplified, the configuration of the robot 10 may also be simplified, so that costs may be reduced.

In this way, when the movable buffer 110 is adopted as a buffer, the weight of the moving subject may be reduced, as compared with a case where a movable robot is adopted as the robot 10, so that the moving mechanism may be simplified. As a result, the operation rate of the moving mechanism is improved, and the availability for the transfer of the substrate W may increase, so that the transfer efficiency of the substrate W may be improved.

In recent years, there has been a tendency that the processing time for the substrate W in each processing chamber PC increases due to, for example, the multi-layering of semiconductors formed on the substrate W. Accordingly, there is a demand for increasing the number of processing chambers PC per transfer chamber 100, so as to improve the number of substrates to be processed per unit time.

The demand may be satisfied by improving the transfer efficiency of the substrate W in the transfer chamber 100, as in the transfer system 1. Further, by adopting a fixed robot as the robot 10, the height of the transfer chamber 100 may be reduced, thereby reducing the volume of the transfer chamber 100. As a result, the operation costs of the transfer chamber 100 may be reduced.

While FIG. 1 illustrates only a portion of the transfer chamber 100, an example of the arrangement of the processing chambers PC, the robots 10, the movable buffer 110 and others in the entire transfer chamber 100 will be described later using, for example, FIG. 3. Further, an example of the configuration of each robot 10 and the movable buffer 110 will be described later using, for example, FIG. 4.

While the robot 10 illustrated in FIG. 1 is also able to access a load lock chamber that corresponds to the entrance/exit of the substrate W in the transfer chamber 100, variations may be made to the shape of the top surface of the transfer chamber 100 and the arrangement of the load lock chamber and the processing chambers PC.

Thus, hereinafter, an example of the arrangement of the load lock chamber will be described using FIGS. 2A and 2B. For a load lock chamber provided with a robot therein, when the robot is able to transfer the substrate W to/from the movable buffer 110, the robot 10 illustrated in FIG. 1 is not required to have the ability to access the load lock chamber. Further, as illustrated in FIG. 1, the apparatus that includes the robots 10 and the movable buffer 110 may be referred to as a transfer apparatus 5.

Figure 2A:
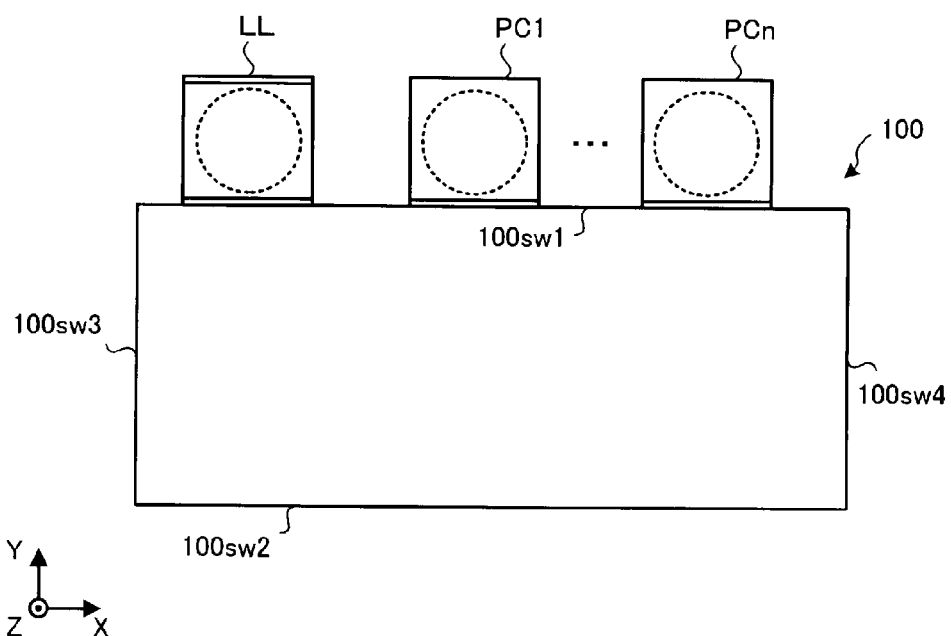
FIG. 2A is a schematic top view illustrating an example (part 1) of an arrangement of a load lock chamber.
Figure 2B:
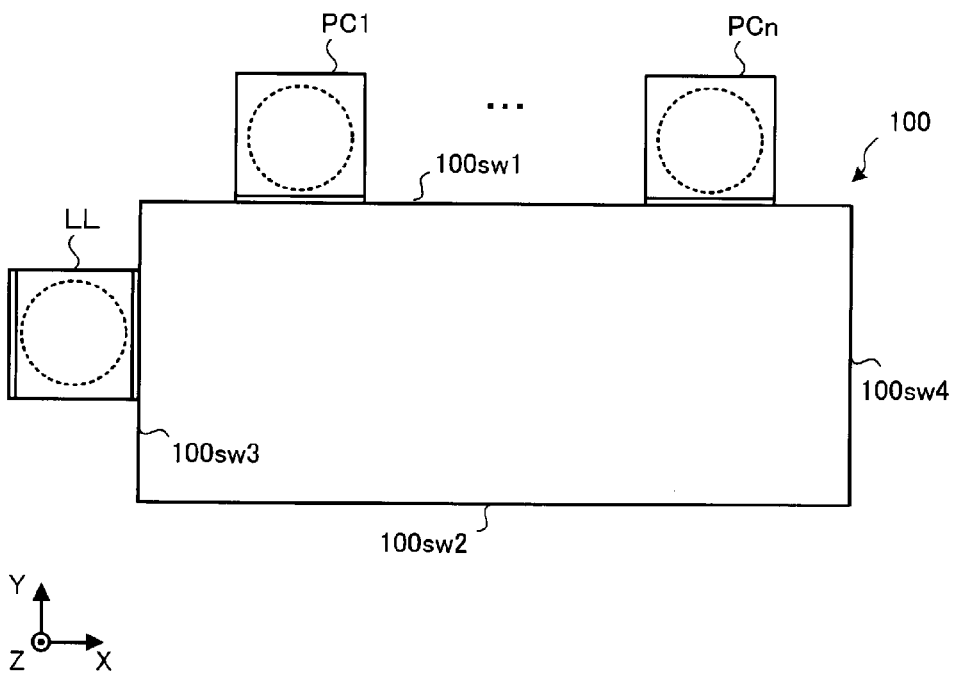
FIG. 2B is a schematic top view illustrating an example (part 2) of the arrangement of the load lock chamber.

FIGS. 2A and 2B are schematic top views illustrating examples (parts 1 and 2) of the arrangement of the load lock chamber LL. FIGS. 2A and 2B omit the illustration of the robots 10 and the movable buffer 110 illustrated in FIG. 1. Further, FIGS. 2A and 2B represent a case where the transfer chamber 100 has a rectangular shape in the top view, and the processing chambers PC are provided on the relatively long sides of the rectangular shape. When the processing chambers PC are arranged on the relatively long sides of the rectangular transfer chamber 100, the transfer chamber 100 may be flexibly expanded even in a case where the number of processing chambers PC increases.

Further, FIGS. 2A and 2B represent the side walls 100sw that correspond to the relatively long sides of the rectangle (see, e.g., FIG. 1) as the side walls 100sw1 and 100sw2, respectively, and represent the side walls 100sw that correspond to the relatively short sides of the rectangle as the side walls 100sw3 and 100sw4, respectively. Further, FIGS. 2A and 2B represent the plurality of processing chambers PC (e.g., an "n" number of processing chambers PC) as processing chambers PC1 to PCn.

FIG. 2A represents a case where the load lock chamber LL is provided on the side wall 100sw1 on which the plurality of processing chambers PC are provided. Here, the load lock chamber LL changes its internal pressure between the decompressed atmosphere and the atmospheric-pressure atmosphere. For example, when the substrate W (see, e.g., FIG. 1) is carried into the transfer chamber 100 from the outside, the internal pressure of the load lock chamber LL is adjusted to the atmospheric-pressure atmosphere, and a first port that is an outward opening of the load lock chamber LL is opened. After the first port is closed, the internal pressure of the load lock chamber LL is adjusted to the decompressed atmosphere, and a second port that is an opening of the load lock chamber LL toward the transport chamber 100 is opened.

FIG. 2B represents a case where the load lock chamber LL is provided on the side wall 100sw3 (e.g., the relatively short side) adjacent to the side wall 100sw1 (e.g., the relatively long side) on which the plurality of processing chambers PC are provided. In this way, the load lock chamber LL may be disposed on the side wall 100sw different from the side wall 100sw on which the processing chambers PC are provided. While FIG. 2B represents a case where the load lock chamber LL is provided on the side wall 100sw3, the load lock chamber LL may be provided on the side wall 100sw4.

Further, while FIGS. 2A and 2B represent a case where the transfer chamber 100 has a rectangular shape in the top view, the transfer system 1 illustrated in FIG. 1 may well be applied even when the transfer chamber 10 has other shapes such as a polygonal or circular shape. Hereinafter, the configuration of the transfer system 1 will be described in more detail.

Figure 3:
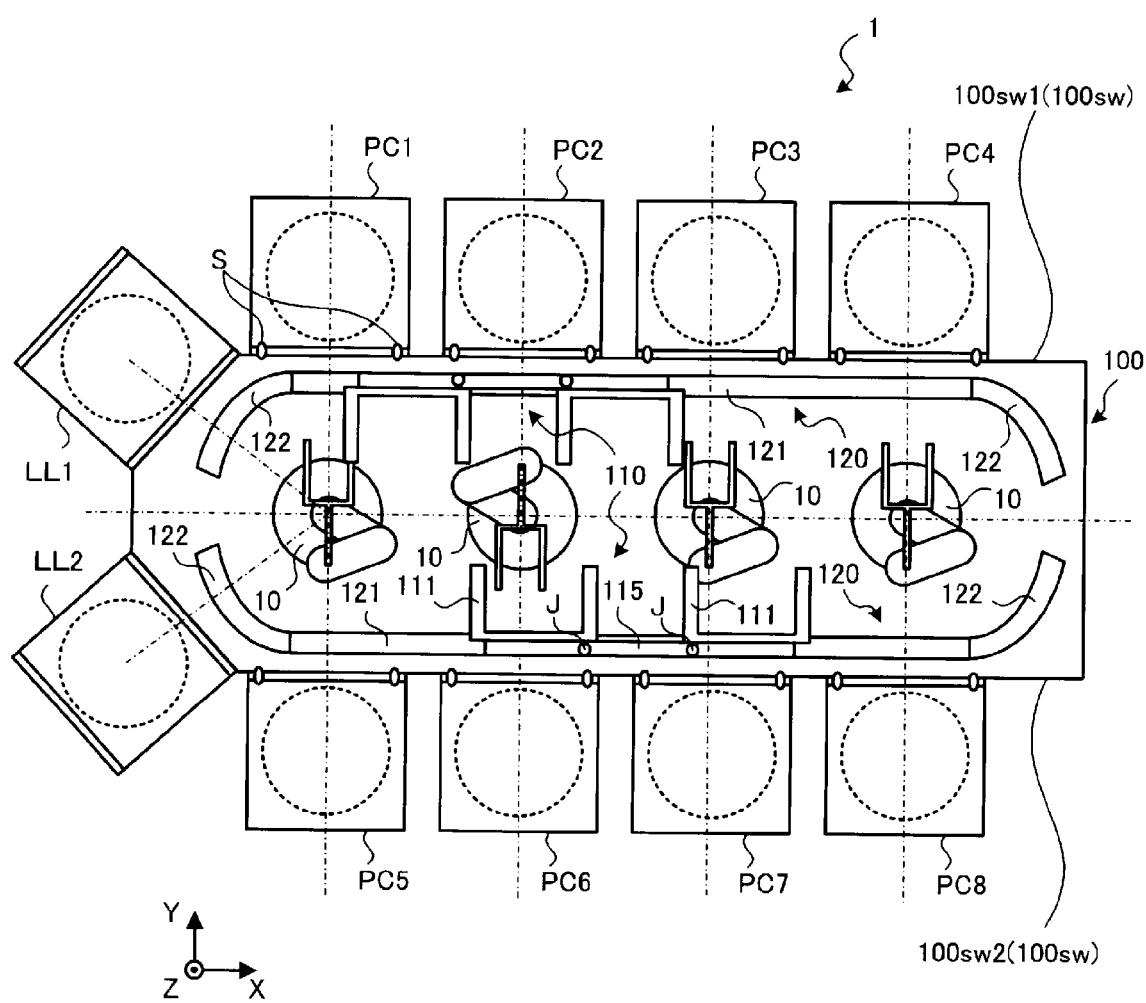
FIG. 3 is a schematic top view illustrating a transfer system according to an embodiment.

FIG. 3 is a schematic top view of the transfer system 1 according to the embodiment. As illustrated in FIG. 3, four processing chambers PC are provided at each side of the opposite positions of the side walls 100sw1 and 100sw2 which are parallel to each other. Further, each robot 10 is disposed at an intermediate position between the processing chambers PC of which openings face each other, in front of the openings of the processing chambers PC.

Specifically, a total number of four robots 10 are arranged such that one is disposed in front of the processing chambers PC1 and PC5, another one is disposed in front of the processing chambers PC2 and PC6, yet another one is disposed in front of the processing chambers PC3 and PC7, and the other one is disposed in front of the processing chambers PC4 and PC8.

The load lock chambers LL are arranged on the side wall 100sw which is not parallel to the side walls 100sw1 and 100sw2, and are accessible from the robot 10 disposed closest to the load lock chambers LL (see, e.g., the load lock chambers LL1 and LL2).

That is, at least one of the plurality of robots 10 exchanges the substrate W (see, e.g., FIG. 1) between the movable buffer 110 and a processing chamber PC or a load lock chamber LL. In this way, when the robot 10 in the transfer chamber 100 accesses the load lock chambers LL as well, it is unnecessary to provide a robot in each load lock chamber LL, so that the load lock chambers LL may be downsized.

As illustrated in FIG. 3, the transfer chamber 100 is symmetric with respect to the "line of symmetry" parallel to the side walls 100sw1 and 100sw2. Thus, hereinafter, the configuration of the transfer chamber 100 close to the side wall 100sw1 (e.g., on the side of the positive direction of the Y axis) will be mainly described.

As illustrated in FIG. 3, the side wall 100sw1 is linear in the top view, and the plurality of processing chambers PC (e.g., PC1 to PC4) are arranged in the horizontal direction on the side wall 100sw1. The robots 10 are provided along the arrangement direction of the processing chambers PC. The movable buffer 110 moves along a track 120 fixed to, for example, the floor surface of the transfer chamber 100. The movable buffer 110 and the track 120 may be collectively referred to as the movable buffer 110. The configuration of the movable buffer 110 and the track 120 will be described later using FIG. 4.

The track 120 includes a linear track 121 that has a straight-line shape. In this way, when the movable buffer 110 moves along the linear track 121, the position accuracy of the movable buffer 110 may be improved. While FIG. 3 illustrates two linear tracks 121 because the processing chambers PC are provided on both the side walls 100*sw* that face each other, the number of linear tracks 121 may be one.

At least one of the plurality of linear tracks 121 may be so-called "double tracks." In this case, the double tracks may have a height difference in order to prevent the movable buffers 110 moving on the double tracks, respectively, from interfering with each other. Further, the "double tracks" may be provided by arranging the linear tracks 121 having different heights to be adjacent to each other.

The track 120 may include a curved portion 122 that is curved in a direction away from the side wall 100*sw*, at at least one of both the ends of the linear track 121. When the curved portion 122 is provided at one end of the linear track 121, the curved portion 122 may be used as a retreating place of the movable buffer 110 or a reset place for resetting the position of the movable buffer 110. As a result, the availability of the movable buffer 110 may be improved. Further, the curved portion 122 may branch from the middle of the linear track 121.

FIG. 3 illustrates the track 120 provided with the curved portion 122 at each end of the linear track 121. In the following descriptions, for example, in a case where the curved portion 122 connects the two linear tracks 121 to each other, the "curved portion 122" may be referred to as a "curved track 122."

As illustrated in FIG. 3, the transfer chamber 100 includes the linear track 121 provided between the side wall 100*sw*1 and the robots 10, and the linear track 121 provided between the side wall 100*sw*2 and the robots 10. Further, at least one movable buffer 110 moves along each linear track 121. In this way, when the linear tracks 121 are provided in parallel to each other while interposing the robots 10 therebetween, each robot 10 may use the movable buffer 110 that moves on the linear track 121 relatively close to a processing chamber PC, so that the moving distance of the substrate W may be reduced when the substrate W is transferred. Accordingly, the transfer efficiency of the substrate W may be improved.

Here, the movable buffer 110 illustrated in FIG. 3 includes holding modules 111 that hold the substrate W, and a connection module 115. The holding modules 111 are connected to both the ends of the connection module 115 in the horizontal direction via joints J that allow a horizontal rotation.

In this way, the holding modules 111 may be connected to both the ends of the connection module 115. As a result, even when the moving range of the connection module 115 is limited to the linear track 121, the holding modules 111 may move to the curved portions 122 provided at the ends of the linear track 121. When it is sufficient that the movable buffer 110 moves on the linear track 121, a non-rotatable type of joint J may be provided, or the joint J itself may be omitted such that the holding modules 111 and the connection module 115 may be fixed to and integrated with each other.

For example, the movable buffer 110 may move the holding module 111 to the front of the load lock chamber LL1 along the curved portion 122, in a state where the connection module 115 is disposed on the linear track 121. Further, the movable buffer 110 may move any one of the connected holding modules 111 to the front of a processing chamber PC (e.g., PC1 to PC4).

As illustrated in FIG. 3, a pair of substrate detection sensors S is provided in the opening of each processing chamber PC, and may detect at least two points on the outer periphery of the substrate W, so as to calculate the central position of the substrate W transferred to the processing chamber PC. As a result, the positional deviation between the substrate W and the robot 10 that transfers the substrate W may be detected, and the operation of the robot 10 may be corrected so that the substrate W may be moved to a regular position in the processing chamber PC. Further, the substrate detection sensors S may be provided on the floor surface or the ceiling surface of the transfer chamber 100.

Among the plurality of robots 10, the robot 10 closest to the load lock chambers LL is able to access the load lock chambers LL1 and LL2, and the processing chambers PC1 and PC5. The other robots 10 are able to access their facing processing chambers PC (e.g., the processing chambers PC2 and PC6, the processing chambers PC3 and PC7, and the processing chambers PC4 and PC8), respectively. As described above, the holding module 111 of the movable buffer 110 may move to the front of each processing chamber PC (PC1 to PC8).

Figure 4:
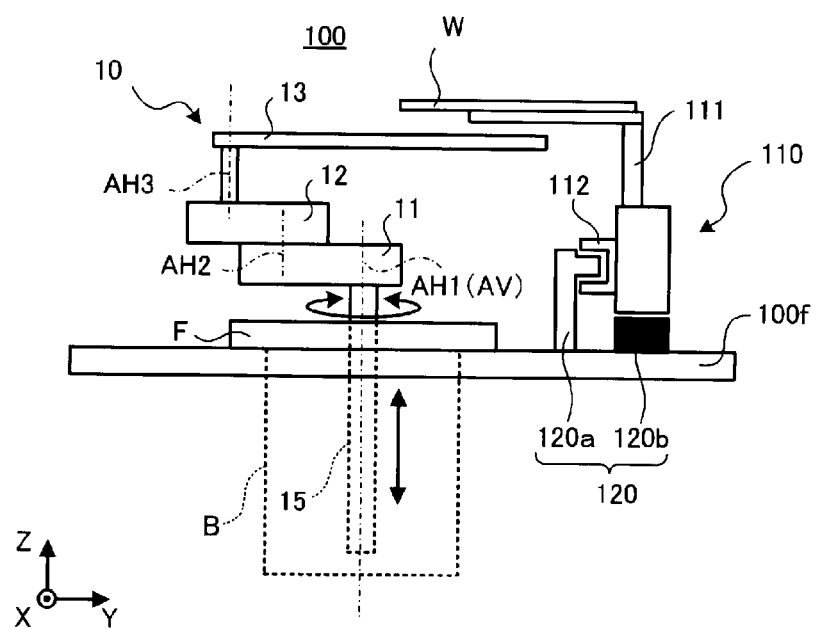
FIG. 4 is a schematic side view of a robot and a movable buffer.

Next, an example of the configuration of the robot 10 and the movable buffer 110 will be described using FIG. 4. FIG. 4 is a schematic side view of the robot 10 and the movable buffer 110. Further, FIG. 4 represents a schematic side view of the robot 10 and the movable buffer 110 illustrated in FIG. 1 when viewed from the positive direction of the X axis.

First, an example of the configuration of the robot 10 will be described. As illustrated in FIG. 4, the robot 10 includes a first arm 11, a second arm 12, a hand 13, a lifting mechanism 15, a flange F, and a base B.

The base B of the robot 10 penetrates the floor 100*f* of the transfer chamber 100, and projects outside the transfer chamber 100. The flange F supports the robot 10 on the upper surface of the floor 100*f*, and maintains the airtightness of the transfer chamber 100. In this way, when the base B of the robot 10 projects from the transfer chamber 100, the volume of the transfer chamber 100 may be reduced. Further, feeding power to the robot 10 from the outside of the transfer chamber 100 or accessing the robot 10 may be readily performed.

The lifting mechanism 15 supports the base end of the first arm 11 to be rotatable around a first rotation axis AH1, and moves up and down along a lifting axis AV. The lifting mechanism 15 itself may be rotated around the first rotation axis AH1. The first arm 11 supports the base end of the second arm 12 at the tip end thereof, to be rotatable around a second rotation axis AH2. The second arm 12 supports the base end of the hand 13 at the tip end thereof, to be rotatable around a third rotation axis AH3. For example, as illustrated in FIG. 1 or 3, the hand 13 includes a fork portion formed such that the tip end of the hand 13 is bifurcated, and supports the substrate W on the upper surface thereof. The hand 13 may hold a plurality of substrates W in multiple stages.

Here, the first arm 11, the second arm 12, and the hand 13 that correspond to horizontal arms may pivot independently of each other around the first rotation axis AH1, the second rotation axis AH2, and the third rotation axis AH3, respectively. Further, the second arm 12 and the hand 13 may pivot by being driven by the pivoting of the first arm 11 around the first rotation axis AH1.

When the first arm 11, the second arm 12, and the hand 13 pivot independently from each other, three driving sources (e.g., actuators) are required, and when the second arm 12 and the hand 13 may be driven by the pivoting of the first arm 11, one or two driving sources are required. Further, the robot 10 requires another driving source for moving the lifting mechanism 15 up and down. Here, variations may be made to the configuration of the axes of the robot 10, and details thereof will be described later using FIGS. 5A to 5D.

Next, an example of the configuration of the movable buffer 110 will be described. The movable buffer 110 includes the holding module 111 that holds the substrate W, and a driving module 112. Here, the driving module 112 illustrated in FIG. 4 corresponds to a mover of a moving-magnet type linear motor. Thus, in the following descriptions, the "driving module 112" may be referred to as a "mover 112." Here, the type of linear motor is not limited to the moving-magnet type, and may be an induction (e.g., dielectric) type. In the present embodiment, a case where the moving-magnet type linear motor, that is, the mover 112 includes a permanent magnet will be described. However, the mover 112 may be formed of a material that moves by the flow of a dielectric current.

Further, the track 120 includes a stator 120a that corresponds to a stator of the linear motor, and a guide 120b. In the present embodiment, a case where the movable buffer 110 moves on the track 120 by the driving force of the linear motor will be described. However, the movable buffer 110 may be a contact type, or a non-contact type such as a magnetic levitation type or an air levitation type. The guide 120b is a support member that guides a linear or curved movement in a plane such as a horizontal plane. In the case illustrated in FIG. 4, the guide 120b guides the linear movement of the movable buffer 110 in the direction along the X axis.

In this way, the driving module 112 of the movable buffer 110 is driven in a non-contact manner by the stator 120a included in the track 120. For example, the stator 120a is formed by molding a winding with a resin or the like, and covering the surface of the mold with a film-like metal. This metal film is also called a can, and traps a gas generated from the resin or the like inside. In this way, the movable buffer 110 is driven in a moving-magnet type non-contact manner, which contributes to the cleanliness of the transfer chamber 100. Further, power may be fed to the stator 120a through the floor 100f of the transfer chamber 100, which also contributes to the cleanliness of the transfer chamber 100.

As illustrated in FIG. 4, when the movable buffer 110 holds the substrate W, the robot 10 moves the hand 13 up, so as to receive the substrate W as if to lift up the substrate W. In contrast, when the hand 13 holds the substrate W, the robot 10 moves the hand 13 down, so as to deliver the substrate W to the movable buffer 110.

The position of the holding module 111 in the top view may be acquired based on a variation in current or voltage of the stator 120a of the track 120 or a detection result of a position sensor appropriately provided on the guide 120b.

Next, an example of the configuration of the robot 10 will be described using FIGS. 5A to 5D. FIGS. 5A to 5D are schematic top views illustrating examples (parts 1 to 4) of the configuration of the robot 10.

Figure 5A:
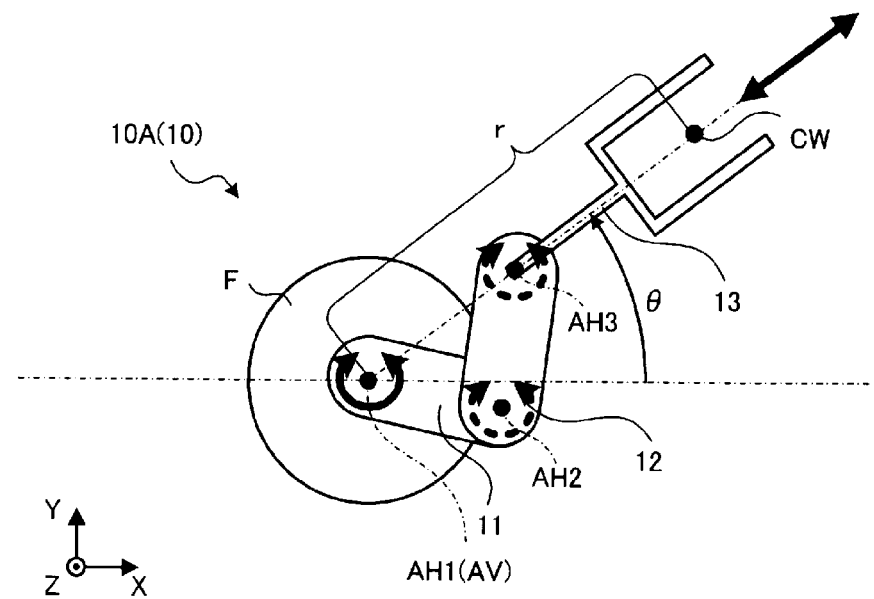
FIG. 5A is a schematic top view illustrating an example (part 1) of a configuration of a robot.

The robot 10 illustrated in FIG. 5A is a first robot 10A with three degrees of freedom which include one degree of freedom in the vertical direction and two degrees of freedom in the horizontal direction. While FIG. 5A represents a lifting axis AV and a first rotation axis AH1 to be coaxial, the axes may not be coaxial. The first arm 11, the second arm 12, and the hand 13 which are horizontal arms operate in cooperation with each other, such that the substrate center CW moves in the radial direction of the first rotation axis AH1 while maintaining the posture of the hand 13.

That is, the second arm 12 is driven to pivot around the second rotation axis AH2, and the hand 13 is driven to pivot around the third rotation axis AH3, by the driving force for pivoting the first arm 11 around the first rotation axis AH1, and a transmission mechanism. As the transmission mechanism, for example, a belt, a gear, or a link mechanism may be used. The "substrate center CW" indicates the central position of the substrate W when the hand 13 holds the substrate W at a regular position.

In this way, the first robot 10A changes the distance "r" from the first rotation axis AH1 to the substrate center CW, while constantly maintaining the angle θ of the straight line that passes through the first rotation axis AH1, the third rotation axis AH3, and the substrate center CW. Here, the angle θ may be any angle. As described above, the first robot 10A is the robot 10 with three degrees of freedom which include one degree of freedom in the vertical direction and two degrees of freedom in the horizontal direction. In the following descriptions, the first robot 10A may be referred to as an "ROZ robot."

When the first robot 10A that is the ROZ robot is used as the robot 10, costs for the robot 10 may be reduced, as compared with a case where the robot 10 has four or more degrees of freedom. Further, when the first robot 10A is used as the robot 10, the first robot 10A is disposed in front of the processing chamber PC or the load lock chamber LL. In other words, when the robot 10 is disposed in front of the processing chamber PC or the load lock chamber LL, the ROZ robot with three degrees of freedom may be used as the robot 10.

Figure 5B:
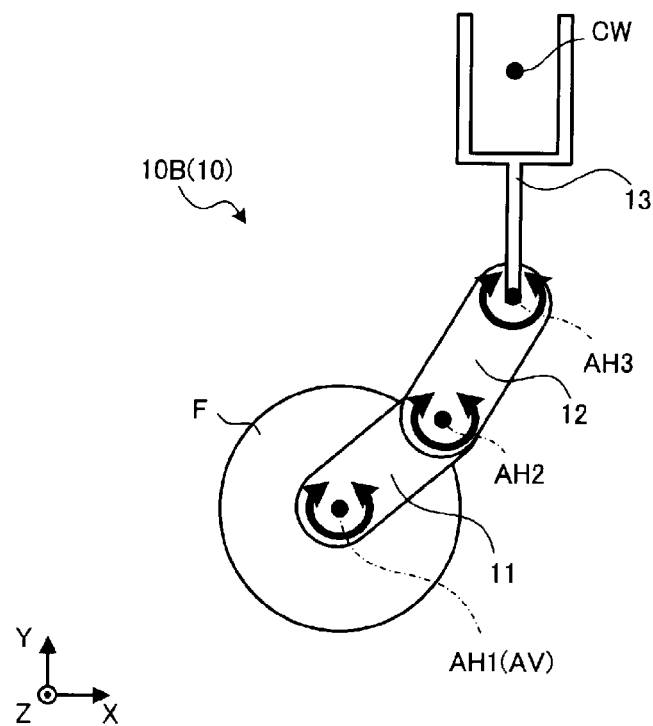
FIG. 5B is a schematic top view illustrating an example (part 2) of a configuration of a robot.

The robot 10 illustrated in FIG. 5B is a second robot 10B with four or more degrees of freedom which include one degree of freedom in the vertical direction and three or more degrees of freedom in the horizontal direction. While FIG. 5B represents the lifting axis AV and the first rotation axis AH1 to be coaxial, the axes may not be coaxial. Unlike the first robot 10A illustrated in FIG. 5A, the first arm 11, the second arm 12, and the hand 13 that are horizontal arms pivot independently from each other around the first rotation axis AH1, the second rotation axis AH2, and the third rotation axis AH3, respectively.

In this way, since the second robot 10B has at least one redundant axis in the horizontal direction, the second robot 10B may move the substrate center CW in any path. Thus, when the second robot 10B is used as the robot 10, the second robot 10B is not required to be disposed in front of the processing chamber PC or the load lock chamber LL. In other words, the robot 10 may deliver the substrate W to/from the processing chamber PC or the load lock chamber LL, even though the robot 10 is not disposed in front of the processing chamber PC or the load lock chamber LL.

Figure 5C:
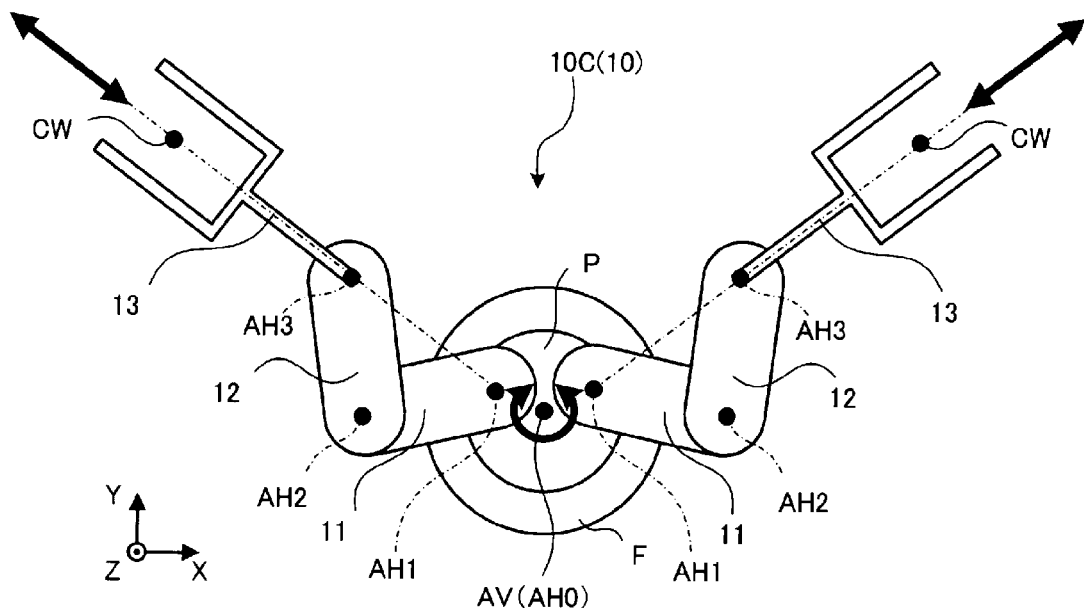
FIG. 5C is a schematic top view illustrating an example (part 3) of a configuration of a robot.

The robot 10 illustrated in FIG. 5C is a third robot 10C in which the horizontal arm of the first robot 10A illustrated in FIG. 5A is used as a dual arm (both arms). That is, the third robot 10C includes a dual arm that each has two degrees of freedom in the horizontal direction, and one degree of freedom in the vertical direction. Specifically, the base ends of the two first arms 11 are supported by a pedestal P, and the pedestal P moves up and down along the lifting axis AV and rotates around a rotation axis AH0. While FIG. 5C represents a case where the dual arm includes the horizontal arm of the first robot 10A illustrated in FIG. 5A, the dual arm may include the horizontal arm of the second robot 10B illustrated in FIG. 5B. Further, the rotation axis AH0 may be omitted.

Figure 5D:
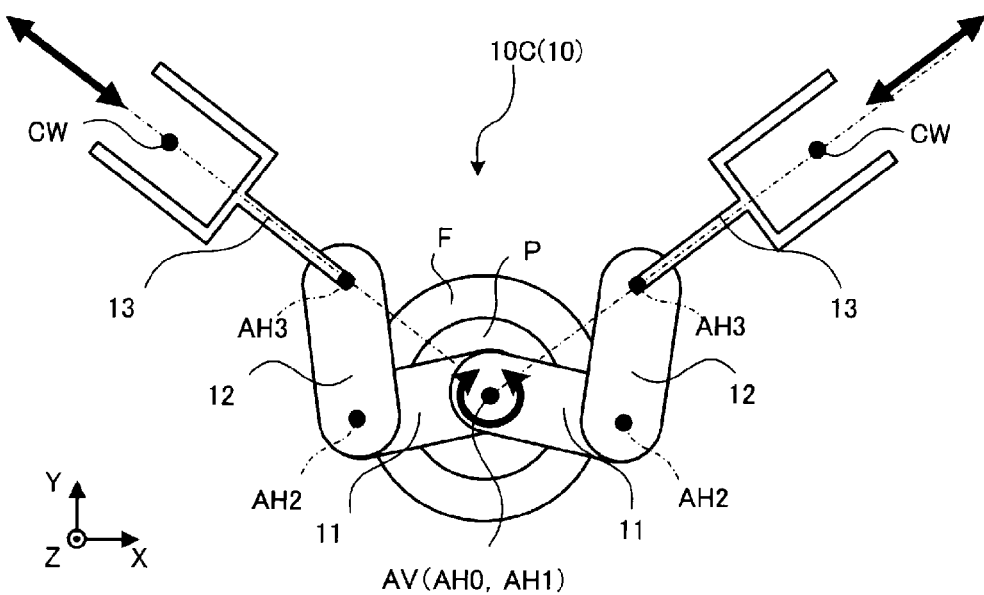
FIG. 5D is a schematic top view illustrating an example (part 4) of a configuration of a robot.

The third robot 10C illustrated in FIG. 5D is a modification of the third robot 10C illustrated in FIG. 5C. The third robot 10C illustrated in FIG. 5D is different from the third robot 10C illustrated in FIG. 5C in that the lifting axis AH0 and the two first rotation axes AH1 of the dual arm are coaxial. With the configuration, the compact size of the third robot 10C may be implemented, so that the volume of the transfer chamber 100 may be reduced. Further, the vertical relationship of the arms in the dual arm illustrated in FIG. 5D may be reversed. Further, the rotation axis AH0 may be omitted for the same reason as that for the third robot 10C illustrated in FIG. 5C.

Figure 5E:
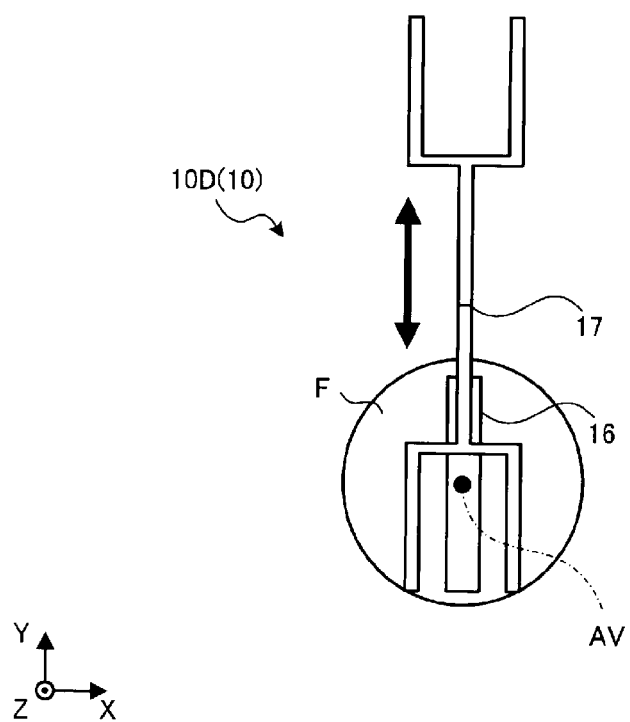
FIG. 5E is a schematic top view illustrating an example (part 5) of a configuration of a robot.

The robot 10 illustrated in FIG. 5E is a robot 10D with two degrees of freedom which include one degree of freedom in the vertical direction and one degree of freedom in the horizontal direction. The robot 10D includes a slider 16 and a double-fork hand 17. The slider 16 supports the double-fork hand 17 in which two fork portions configured to each hold the substrate W are connected back to back, to be movable in the horizontal direction.

Since the robot 10D does not have a rotation axis around the vertical axis, the direction of the double-fork hand 17 may not be changed. Thus, the robot 10D is disposed at a position in front of the processing chambers PC that face each other, on the extension line of the sliding direction of the double-fork hand 17 (e.g., in the Y-axis direction in FIG. 5E).

Next, a modification of the transfer system 1 illustrated in FIG. 3 will be described using FIGS. 6 to 9. FIGS. 6 to 9 are schematic top views of the transfer system 1 according to modifications (parts 1 to 4). In the following descriptions, differences from the transfer system 1 illustrated in FIG. 3 will be mainly described, and overlapping descriptions will be appropriately omitted.

Figure 6:
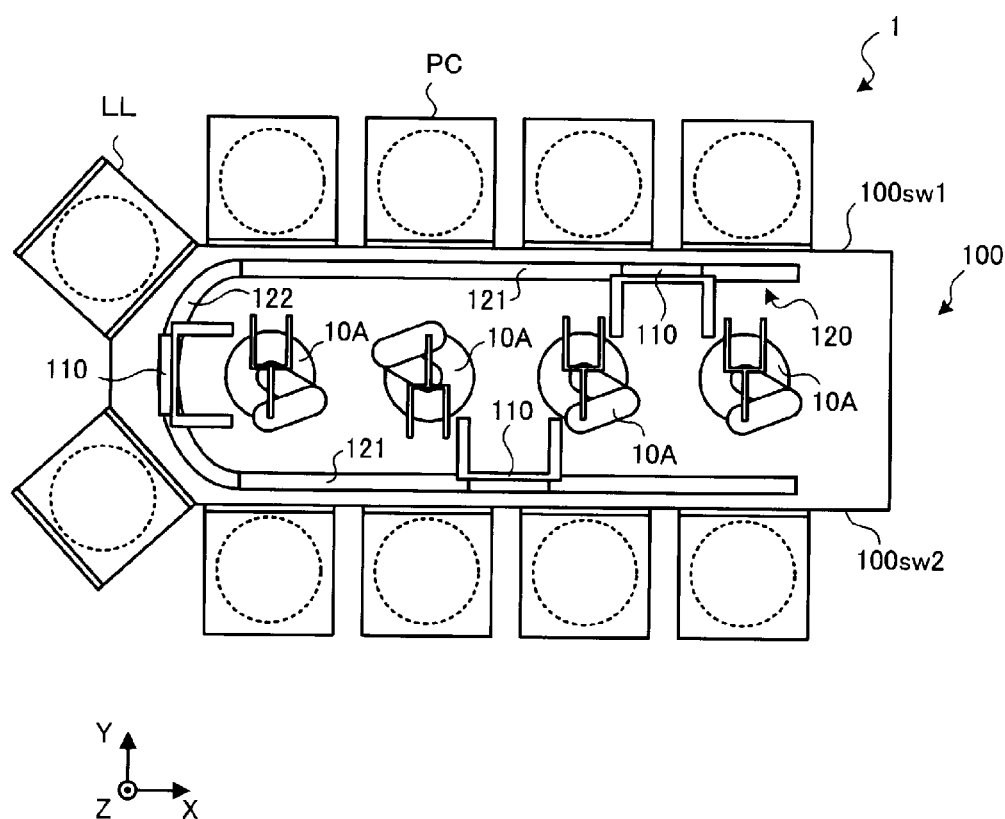
FIG. 6 is a schematic top view of a transfer system according to a modification (part 1).

The transfer system 1 illustrated in FIG. 6 is different from the transfer system 1 illustrated in FIG. 3 in that the shape of the track 120 is so-called a "U-shape." Specifically, in the track 120, one-side ends of the pair of linear tracks 121 are connected to each other to form the curved track 122 (the curved portion 122). Accordingly, each movable buffer 110 may move from one linear track 121 to the other linear track 121 via the curved track 122.

Further, the transfer system 1 illustrated in FIG. 6 is different from the transfer system 1 illustrated in FIG. 3 in that the movable buffers 110 are not connected to each other. Accordingly, each movable buffer 110 may move independently along the track 120. While FIG. 6 represents three movable buffers 110, one or any number of movable buffers 110 may be provided.

FIG. 6 represents a case where the first robot 10A (the ROZ robot) illustrated in FIG. 5A is disposed as the robot 10 (see, e.g., FIG. 3). Further, the positional relationship between the processing chambers PC/the load lock chambers LL and each first robot 10A is similar to that for the robot 10 illustrated in FIG. 3. Meanwhile, the robot 10 illustrated in FIG. 3 may be appropriately selected from the first robots 10A to 10D illustrated in FIGS. 5A to 5D, respectively, according to the positional relationship with the processing chambers PC/the load lock chambers LL.

Figure 7:
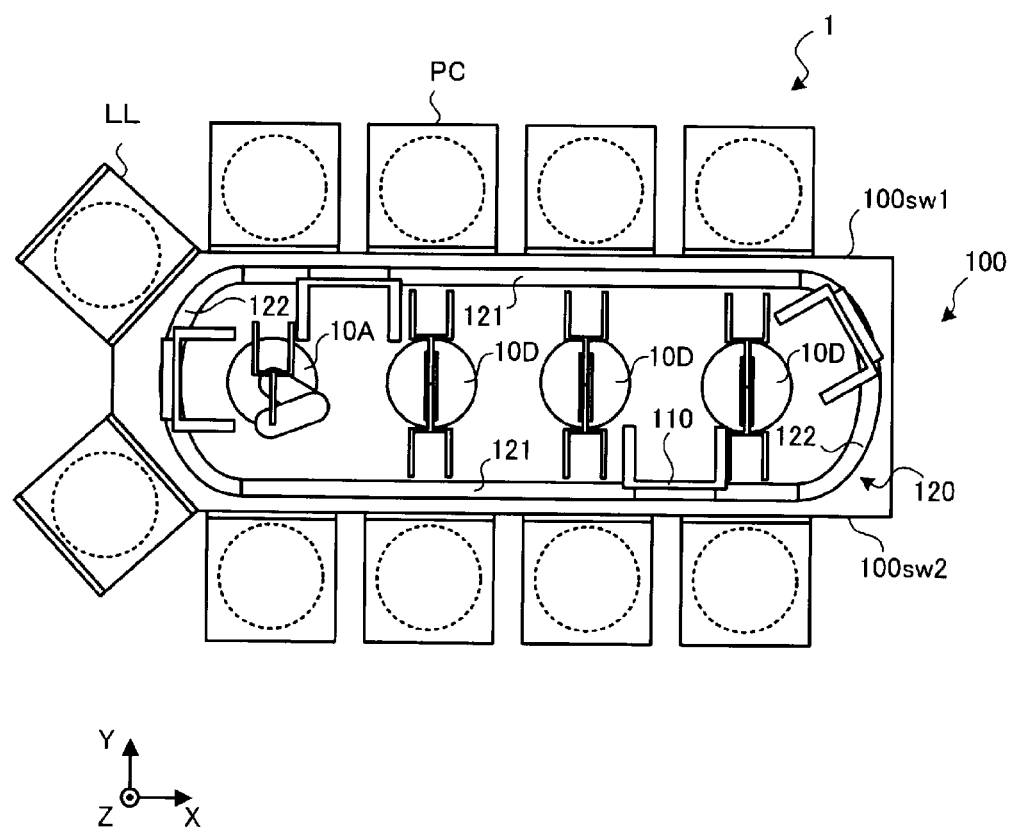
FIG. 7 is a schematic top view of a transfer system according to a modification (part 2).

The transfer system 1 illustrated in FIG. 7 is different from the transfer system 1 illustrated in FIG. 3 in that the track 120 has so-called an "annular" shape, and the movable buffers 110 are not connected to each other. Specifically, in the track 120, the one-side ends of the pair of linear tracks 121 are connected to each other, and the other-side ends of the pair of linear tracks 121 are connected to each other, so as to form the curved tracks 122 (e.g., the curved portions 122), respectively. Accordingly, each movable buffer 110 may circulate independently on the annular track 120. While FIG. 7 represents four movable buffers 110, one or any number of movable buffers 110 may be provided, as in the transfer system 1 illustrated in FIG. 6.

FIG. 7 represents a case where the first robot 10A (e.g., the ROZ robot) illustrated in FIG. 5A is disposed as the robot 10 closest to the load lock chambers LL, and the robot 10D illustrated in FIG. 5D is disposed as each of the other robots 10.

The first robot 10A is able to access each of the two load lock chambers LL and the two processing chambers PC that face each other. Each robot 10D is able to access the two processing chambers PC that face each other. Instead of the robot 10D, the first robot 10A or the second robot 10B may be used.

Figure 8:
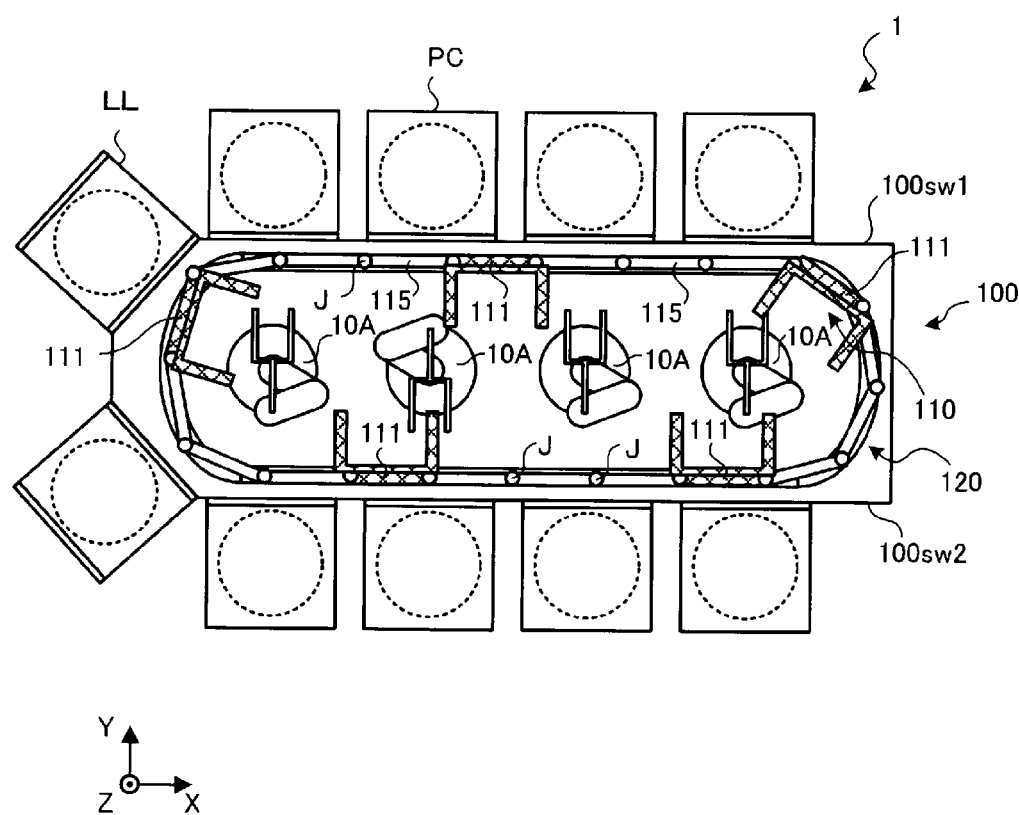
FIG. 8 is a schematic top view of a transfer system according to a modification (part 3).

The transfer system 1 illustrated in FIG. 8 is different from the transfer system 1 illustrated in FIG. 3 in that the track 120 has so-called an "annular" shape," and the movable buffers 110 are connected to each other along the annular track 120. Specifically, the movable buffers 110 include a plurality of connection modules 115 between the holding modules 111, and are connected to each other via joints J that allow a horizontal rotation, so as to form the annular shape.

The annular movable buffers 110 move (circulate) along the annular track 120, so that any one holding module 111 may move to the front of any one processing chamber PC or any one load lock chamber LL. While FIG. 8 represents five holding modules 111, one or any number of holding modules 111 may be provided. Further, while FIG. 8 represents three connection modules 115 between the holding modules 111, one or any number of connection modules 115 may be provided as long as the movable buffers 110 are connected in the annular shape.

While FIG. 8 represents the movable buffers 110 connected in the annular shape, a plurality of movable buffers 110 connected in a non-annular shape may be provided. In this case, each movable buffer 110 may move independently. Further, each of the robots 10 (see, e.g., FIG. 3) is the first robot 10A, as in the transfer system 1 illustrated in FIG. 6.

Figure 9:
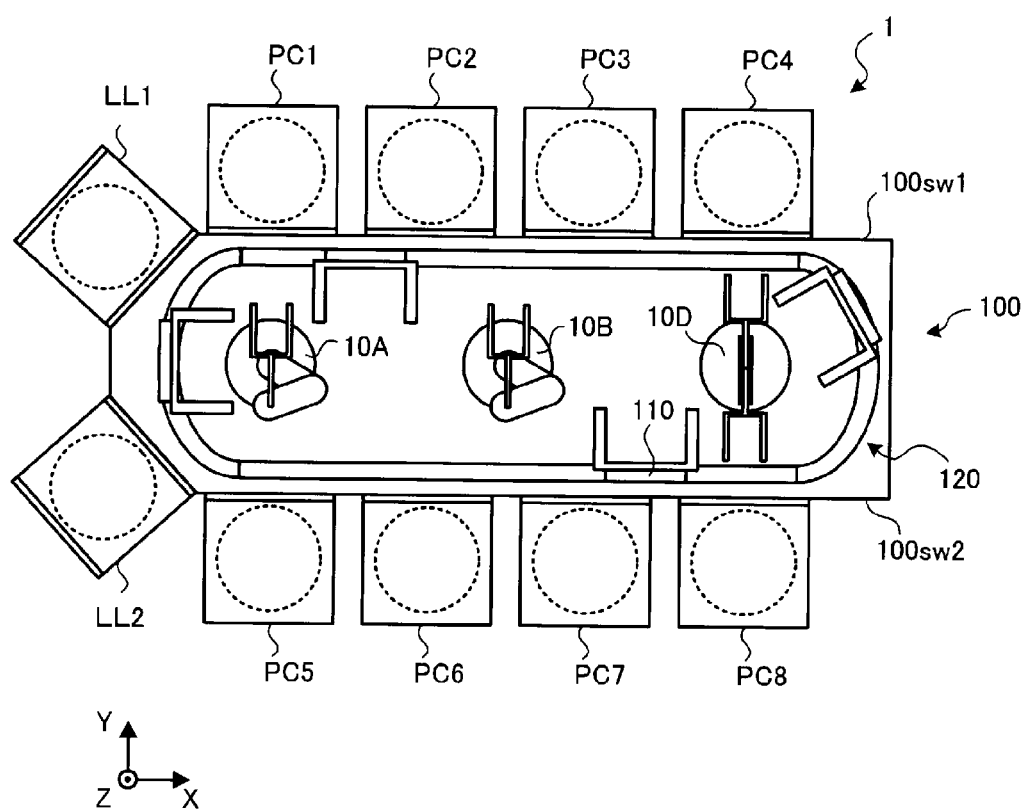
FIG. 9 is a schematic top view of a transfer system according to a modification (part 4).

The transfer system 1 illustrated in FIG. 9 is different from the transfer system 1 illustrated in FIG. 3 in that the track 120 has so-called an "annular" shape, the movable buffers 110 are not connected to each other, and the number of robots 10 (see, e.g., FIG. 3) is small. Since the transfer system 1 illustrated in FIG. 9 is identical to the transfer system 1 illustrated in FIG. 7 in that the track 120 has so-called an "annular" shape, and the movable buffers 110 are not connected to each other, the reduced number of robots 10 will be described below.

Specifically, the robots 10 are the first robot 10A illustrated in FIG. 5A, the second robot 10B illustrated in FIG. 5B, and the robot 10D illustrated in FIG. 5D from the robot relatively closer to the load lock chambers LL. Here, the first robot 10A is able to access the load lock chambers LL1 and LL2, and the processing chambers PC1 and PC5. The second robot 10B is able to access the processing chambers PC2, PC3, PC6, and PC7. The robot 10D is able to access the processing chambers PC4 and PC8.

In this way, when the second robot 10B with four or more degrees of freedom which include one degree of freedom in the vertical direction and three or more degrees of freedom in the horizontal direction is used as the robot 10, the number of accessible processing chambers PC increases, so that the number of robots 10 may be reduced. Further, instead of the first robot 10A or the robot 10D illustrated in FIG. 9, the second robot 10B may be used.

Instead of the first robot 10A illustrated in FIG. 9, the third robot 10C which is a dual-arm robot may be used. In this way, when the third robot 10C which is a dual-arm robot is used as the robot 10 that accesses the load lock chambers LL, it is possible to make a quick access to the load lock chambers LL which tend to become a bottleneck of the transfer process, so that the transfer efficiency of the substrate W may be improved.

Figure 10:
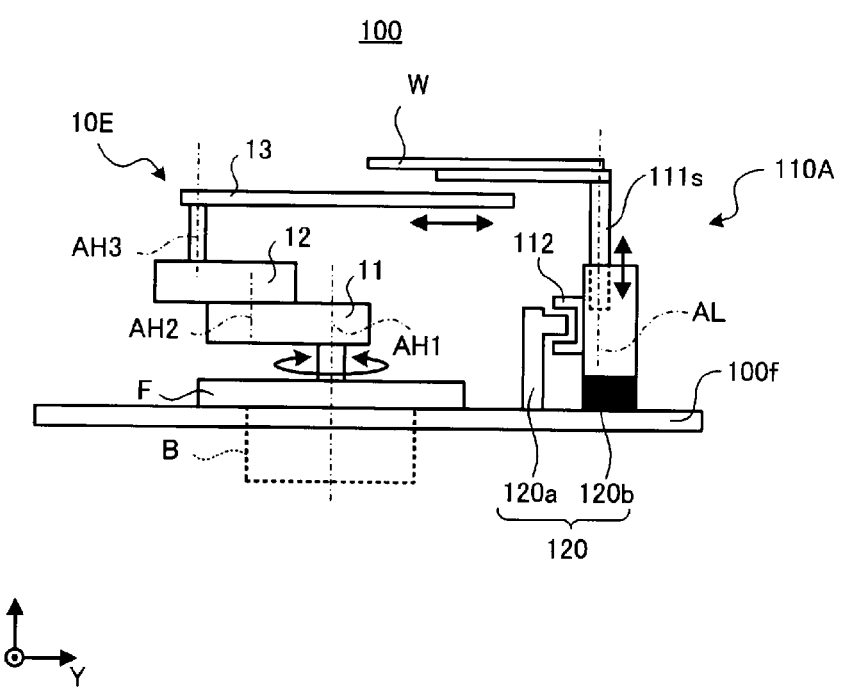
FIG. 10 is a view illustrating a modification of the robot and the movable buffer.

Next, a modification of the robot 10 and the movable buffer 110 illustrated in FIG. 4 will be described using FIG. 10. FIG. 10 is a view illustrating a modification of the robot 10 and the movable buffer 110. Further, FIG. 10 represents a schematic side view similar to FIG. 4. Here, the robot 10 and the movable buffer 110 illustrated in FIG. 10 are different from those in FIG. 4 in that the robot 10 is a fourth robot 10E that does not include the lifting mechanism, and instead, the movable buffer 110 is a movable buffer 110A that includes the lifting mechanism. Thus, hereinafter, the differences from FIG. 4 will be mainly described.

As illustrated in FIG. 10, since the fourth robot 10E omits the lifting axis AV and the lifting mechanism 15 from the robot 10 illustrated in FIG. 4, the fourth robot 10E has two degrees of freedom in the horizontal direction. Further, since the lifting axis AV and the lifting mechanism 15 are omitted, the height of the base B is suppressed to be lower than that of the robot 10 illustrated in FIG. 4. Meanwhile, the movable buffer 110A includes a lift-type holding module 111s that moves up and down along a vertical lift axis AL.

In this way, when the lifting mechanism is omitted from the robot 10, the height of the transfer chamber 100 may be lowered. Further, the configuration of the robot 10 is simplified, so that the availability of the robot 10 may be improved.

Meanwhile, DC power is fed to a driving source (e.g., actuator) for driving the lift-type holding module 111s in a non-contact manner through the track 120. In this way, when power is fed to the movable buffer 110A in the non-contact manner, sensors such as a weight sensor or an optical sensor, and devices such as a wireless-communication camera may be mounted on the movable buffer 110A.

Accordingly, the presence/absence, shape, weight, position and others of the substrate W may be detected while the substrate W is placed on the movable buffer 110A. Further, since costs for feeding the DC power are lower than those for feeding AC power, the supply of DC power contributes to the reduction in costs.

As illustrated in FIG. 10, when the movable buffer 110A holds the substrate W, the movable buffer 110A moves the lift-type holding module 111s down so as to deliver the substrate W to the hand 13 of the fourth robot 10E. On the contrary, when the hand 13 of the fourth robot 10E holds the substrate W, the movable buffer 110A moves the lift-type holding module 111s upward from below so as to receive the substrate W as if to lift up the substrate W.

The first robot 10A illustrated in FIG. 5A, the second robot 10B illustrated in FIG. 5B, the third robot 10C illustrated in FIG. 5C, and the fourth robot 10E illustrated in FIG. 10 may be simply referred to as the robots 10. When the movable buffer 110A provided with the lift-type holding module 111s is used as illustrated in FIG. 10, the lifting mechanism 15 (see, e.g., FIG. 4) may be omitted from the robots 10 illustrated in FIGS. 1 to 9.

Figure 11:
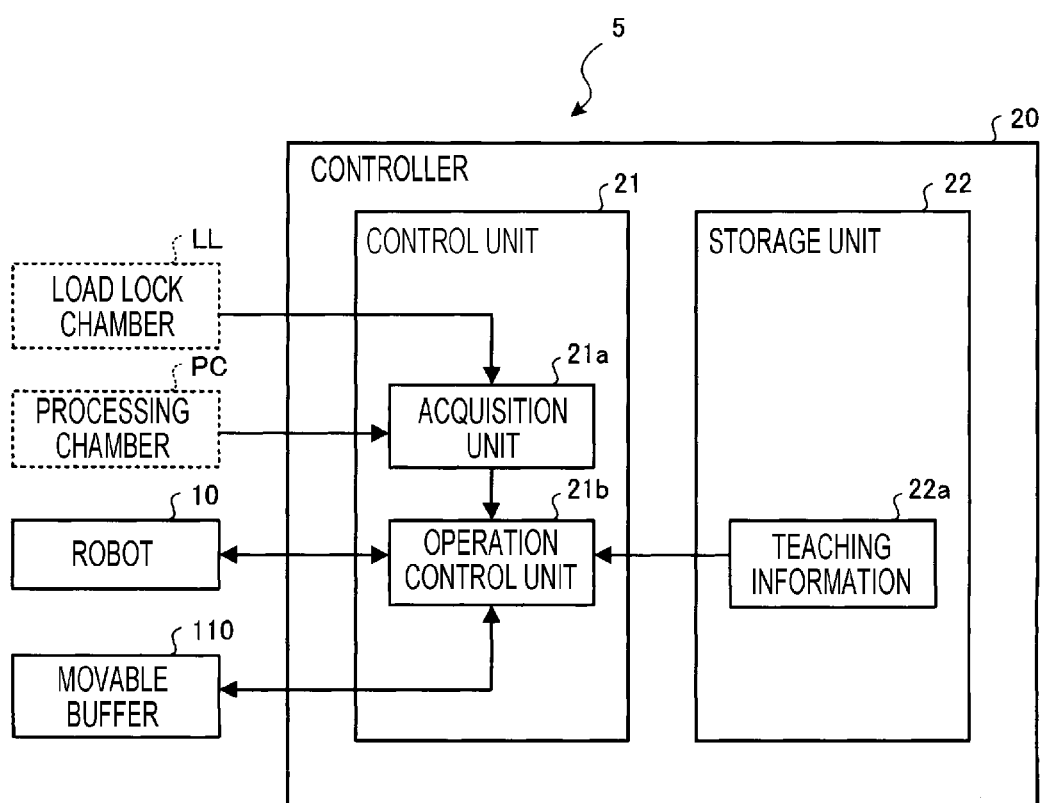
FIG. 11 is a block diagram illustrating a configuration of a transfer apparatus.

Next, the configuration of the transfer apparatus 5 illustrated in FIG. 1 will be described using FIG. 11. FIG. 11 is a block diagram illustrating the configuration of the transfer apparatus 5. As illustrated in FIG. 11, the transfer apparatus 5 includes the robot 10, the movable buffer 110, and a controller 20. The robot 10 and the movable buffer 110 are connected to the controller 20. The load lock chamber LL and the processing chamber PC are also connected to the controller 20, so that the transmission of information is possible.

The controller 20 includes a control unit 21 and a storage unit 22. The control unit 21 includes an acquisition unit 21a and an operation control unit 21b. The storage unit 22 stores teaching information 22a. While FIG. 11 illustrates one controller 20 for the simplification of descriptions, a plurality of controllers 20 may be used. In this case, a higher-level controller may be provided to bind the other controllers. For example, a controller to which the robot 10 is connected and a controller to which the movable buffer 110 is connected may be provided as separate controllers, and a higher-level controller may be provided to bind the controllers.

Here, the controller 20 includes, for example, a computer provided with a CPU (central processing unit), a ROM (read only memory), a RAM (random access memory), an HDD (hard disk drive), an input/output port and others, or various circuits. The CPU of the computer reads and executes programs stored in, for example, the ROM, so as to function as the acquisition unit 21a and the operation control unit 21b of the control unit 21.

Further, at least one or all of the acquisition unit 21a and the operation control unit 21b may be configured by hardware such as an ASIC (application specific integrated circuit) or an FPGA (field programmable gate array).

The storage unit 22 corresponds to, for example, a RAM or an HDD. The RAM or HDD may store the teaching information 22a. The controller 20 may acquire the programs described above or various types of information through another computer or a portable record medium connected via a wired or wireless network. As described above, the controller 20 may be configured by a plurality of devices capable of communicating with each other, or hierarchical devices capable of communicating with a higher- or lower-level device.

The control unit 21 acquires trigger information such as an access request from the load lock chamber LL or the processing chamber PC, and controls the operations of the robot 10 and the movable buffer 110. When a plurality of controllers 20 is provided, the control unit 21 may also perform a synchronization of the plurality of controllers 20.

The acquisition unit 21a acquires the trigger information such as an access request from the load lock chamber LL or the processing chamber PC. Then, the acquisition unit 21a determines an operation timing or operation contents of the robot 10 and the movable buffer 110 based on the acquired information, and notifies the operation control unit 21b of the determined operation timing or operation contents.

For example, the acquisition unit 21a acquires a timing when the substrate W is carried into the load lock chamber LL from the outside, and instructs the operation control unit 21b to operate the robot 10 and the movable buffer 110 in cooperation with each other based on the acquired timing. Further, the acquisition unit 21a acquires a timing when a processing on the substrate W is completed, from the processing chamber PC, and instructs the operation control unit 21b to operate the robot 10 and the movable buffer 110 in cooperation with each other based on the acquired timing.

The operation control unit 21b operates the robot 10 and the movable buffer 110 based on the instruction from the acquisition unit 21a and the teaching information 22a. Further, the operation control unit 21b improves the operation accuracy of the robot 10 and the movable buffer 110 by, for example, performing a feedback control using encoder values in actuators such as rotary motors or linear motors which are the power sources of the robot 10 and the movable buffer 110.

The teaching information 22a is generated at a teaching stage for teaching an operation to the robot 10 and the movable buffer 110, and includes a "job" which is a program that defines an operation path of a robot or the like. When the robots are arranged at regular positions such as line-symmetric positions as illustrated in, for example, FIG. 3, the teaching data may be shared or used inversely. Thus, according to the transfer apparatus 5, it is possible to reduce the time and costs for generating the teaching information 22a that includes the teaching data.

Figure 12:
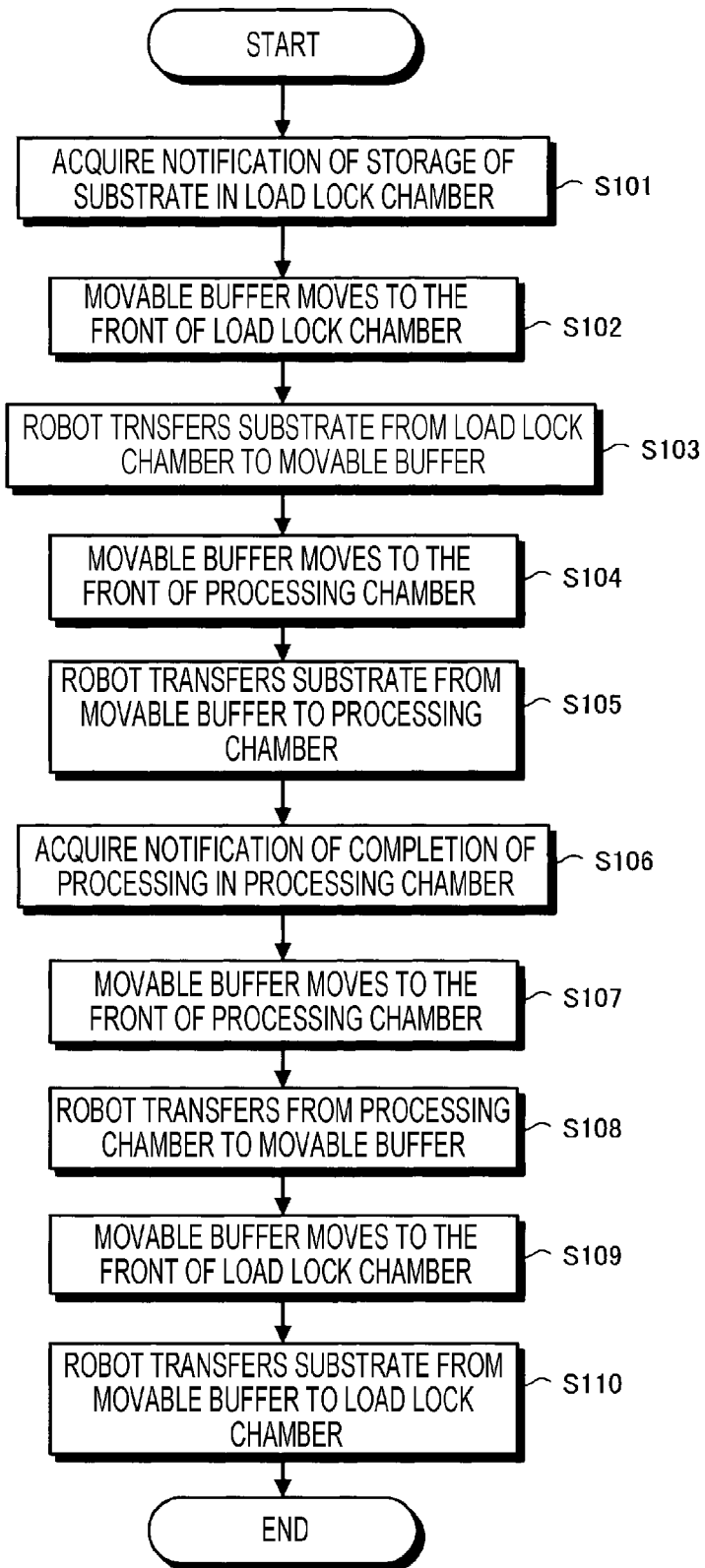
FIG. 12 is a flowchart illustrating a procedure of a process performed by the transfer apparatus.

Next, an example of the procedure of the process performed by the transfer apparatus 5 illustrated in FIG. 1 will be described using FIG. 12. FIG. 12 is a flowchart illustrating the procedure of the process performed by the transfer apparatus 5. As illustrated in FIG. 12, when the acquisition unit 21a of the controller 20 acquires a notification of a storage of the substrate W in the load lock chamber LL (step S101), the movable buffer 110 of which operation is controlled by the operation control unit 21b of the controller 20 moves to the front of the load lock chamber LL (step S102).

Then, the robot 10 of which operation is controlled by the operation control unit 21b of the controller 20 transfers the substrate W from the load lock chamber LL to the movable buffer 110 (step S103). Subsequently, the mobile buffer 110 to which the substrate W has been transferred moves to the front of the processing chamber PC (step S104), and the robot 10 transfers the substrate W from the movable buffer 110 to the processing chamber PC (step S105).

Further, when the acquisition unit 21a of the controller 20 acquires a notification of the completion of a processing on the substrate W in the processing chamber PC (step S106), the movable buffer 110 moves to the front of the processing chamber PC (step S107). Subsequently, the robot 10 transfers the substrate W from the processing chamber PC to the movable buffer 110 (step S108).

Then, the movable buffer 110 to which the substrate W has been transferred moves to the front of the load lock chamber LL (step S109), the robot 10 transfers the substrate W from the movable buffer 110 to the load lock chamber LL (step S110), and the process ends.

While FIG. 12 represents a case where the processes triggered by the acquiring processes in steps S101 and S106, respectively, are performed in series in order to facilitate the understanding of descriptions, the processes triggered by the acquiring processes may be performed in parallel. For example, the exchange of the substrate W with respect to the load lock chamber LL and the exchange of the substrate W with respect to the processing chamber PC may be performed in parallel.

Further, a plurality of movable buffers 110 may be moved in parallel such that a plurality of substrates W may be moved independently from each other, or a movable buffer 110 may hold a plurality of substrates W such that an unprocessed substrate W and a processed substrate W may be moved at the same time.

Figure 13A:
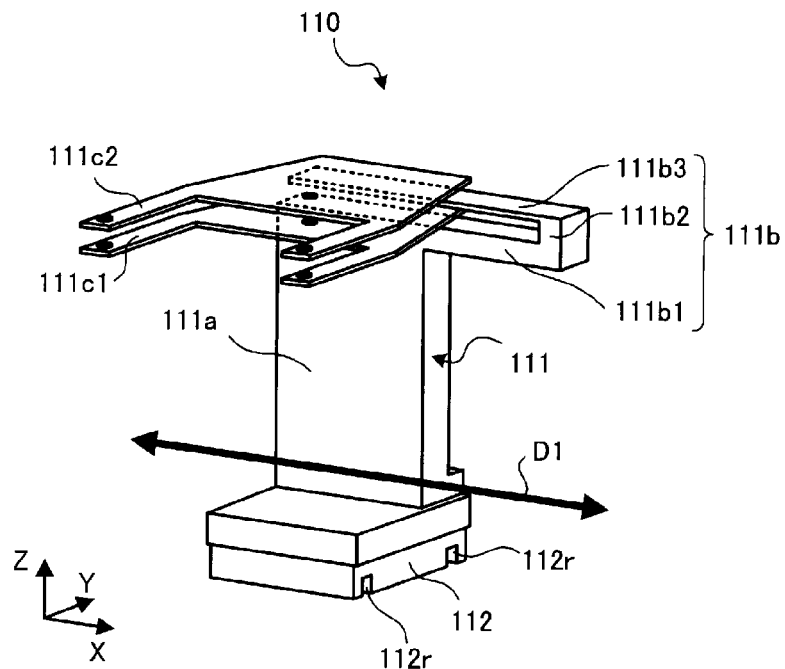
FIG. 13A is a perspective view of a multi-stage movable buffer.

Hereinafter, examples of the movable buffer 110 that holds the substrates W in multiple stages, and the transfer chamber 100 that uses the multi-stage buffer 110 will be described using FIGS. 13A and 13B to 15. First, the multi-stage movable buffer 110 will be described using FIGS. 13A and 13B. FIG. 13A is a perspective view of the multi-stage movable buffer 110. While a two-stage movable buffer 110 will be described below, the number of stages may be three or more.

As illustrated in FIG. 13A, the movable buffer 110 includes the holding module 111 and the driving module 112. The holding module 111 includes a support 111a, a bent portion 111b, and holders 111c1 and 111c2. The support 111a extends upward to support the bent portion 111b at the upper end thereof. The bent portion 111b projects from the support 111a in the horizontal direction D1 (see, e.g., FIG. 1) which is the moving direction of the movable buffer 110.

Specifically, the bent portion 111b includes a projecting portion 111b1 that projects from the support 111a along the horizontal direction D1 such that the upper surface of the bent portion 111b and the upper surface of the support 111a are flush with each other, and a support column 111b2 that is bent upward from the projecting portion 111b1. Further, the bent portion 111b includes a folded-back portion 111b3 that is bent from the support column 111b2 in the direction of returning to the support 111a along the horizontal direction DE The tip end of the folded-back portion 111b3 does not project from the support column 111a when viewed from above.

The holders 111c1 and 111c2 are members that hold the substrates W (see, e.g., FIG. 1), and are supported by the bent portion 111b. Specifically, the holder 111c1 that corresponds to the first stage is supported by the upper surface of the support 111a and the upper surface of the projecting portion 111b1 of the bent portion 111b. The holder 111c2 that corresponds to the second stage is supported by the upper surface of the folded-back portion 111b3. The base ends of the holders 111c1 and 111c2 are supported by the bent portion 111b, and the tip ends thereof are each bifurcated. The space between the holders 111c1 and 111c2 has a size enough to allow the entrance of the hand 13 of the robot 10 (see, e.g., FIG. 4).

As described above, the holding module 111 illustrated in FIG. 13A includes the bent portion 111b that is bent to prevent the interference with the substrate W placed on the first stage. Further, the bent portion 111b has a cantilever shape opened at the side where the support column 111b2 is not provided (e.g., the side of the negative direction of the X axis). Accordingly, even when the substrate W held by the robot 10 (see, e.g., FIG. 4) is entering the bent portion 111b along the Y axis, the movable buffer 110 may avoid the upward/downward movement operation of the robot 10. Specifically, the movable buffer 110 may move toward the side where the support column 111b2 is provided (e.g., in the positive direction of the X axis), so as to avoid the upward/downward movement operation of the robot 10.

While FIG. 13A illustrates the movable buffer 110 in which the bent portion 111b projects rightward (e.g., in the positive direction of the X axis) when viewed from the negative direction of the Y axis, the bent portion 111b may project leftward (e.g., in the negative direction of the X axis). In this case, the avoiding operation described above may be performed in the opposite direction (e.g., in the negative direction of the X axis).

The driving module 112 supports the holding module 111. The driving module 112 has two concave portions 112r that extend along the horizontal direction D1, at the bottom surface thereof. The concave portions 112r correspond to two convex portions 120r (see, e.g., FIG. 13B) of the track 120 (see, e.g., FIG. 3) to be described later, respectively.

Figure 13B:
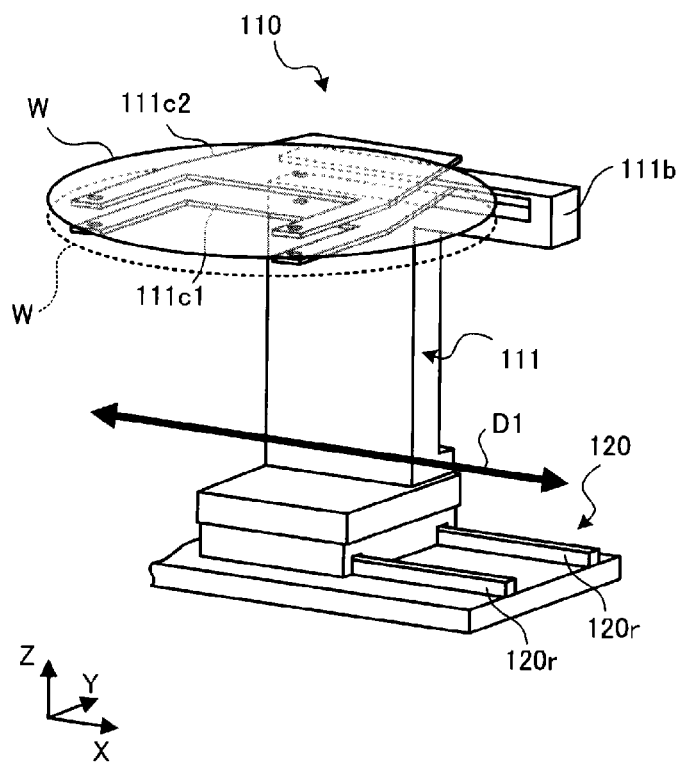
FIG. 13B is a perspective view of the movable buffer and a track.

FIG. 13B is a perspective view of the movable buffer 110 and the track 120. FIG. 13B illustrates the movable buffer 110 in a state of holding the substrates W. In FIG. 13B, the substrate W held by the holder 111c1 that corresponds to the first stage is represented by a dashed line, and the substrate W held by the holder 111c2 that corresponds to the second stage is represented by a solid line.

As illustrated in FIG. 13B, it may be seen that the substrate W held by the holder 111c1 reaches the entrance space of the bent portion 111b. The track 120 has the two convex portions 120r that extend along the horizontal direction D1 at the upper surface thereof. The two convex portions 120r correspond to the two concave portions 112r (see, e.g., FIG. 13A) of the driving module 112 described above, respectively.

Figure 14A:
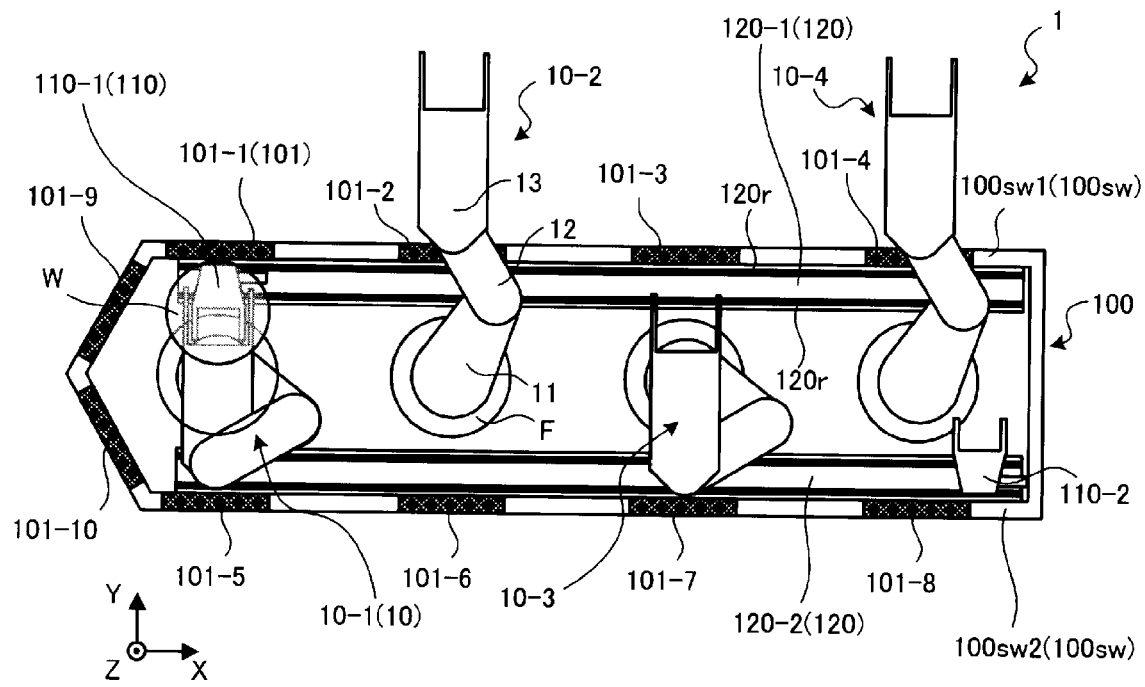
FIG. 14A is a schematic top view of a transfer chamber.
Figure 14B:
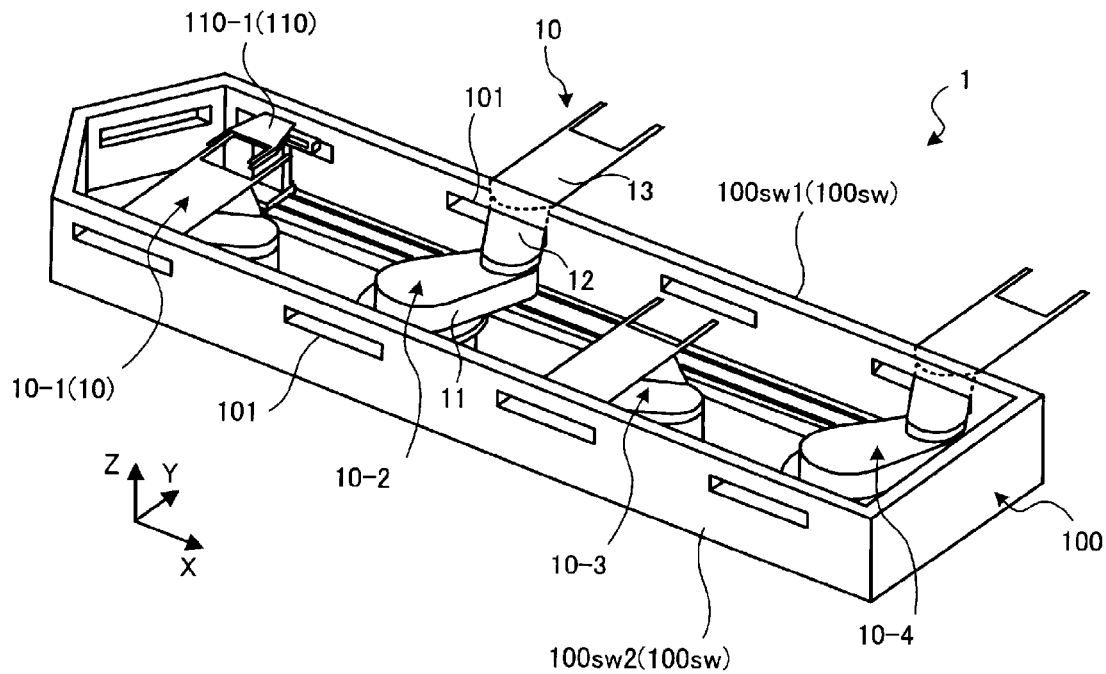
FIG. 14B is a schematic perspective view of the transfer chamber.

Next, the transfer chamber 100 in which the movable buffer 110 illustrated in FIGS. 13A and 13B is provided will be described using FIGS. 14A and 14B. FIG. 14A is a schematic top view of the transfer chamber 100, and FIG. 14B is a perspective top view of the transfer chamber 100. FIGS. 14A and 14B omit the illustration of the processing chambers PC and the load lock chambers LL illustrated in FIG. 3 and others, and instead, illustrate communication ports 101 provided in the side wall 100sw of the transfer chamber 100 and configured to communicate with the processing chambers PC and the load lock chambers LL.

FIGS. 14A and 14B represent the four robots 10 provided in the transfer chamber 100 as in FIG. 3, as robots 10-1, 10-2 . . . from the robot closest to the load lock chambers LL, in order to discriminate the four robots 10 from each other. Further, FIGS. 14A and 14B represent the above-described communication ports 101 as communication ports 101-1, 101-2 . . . for the communication ports 101 provided in the side wall 100sw1, and communication ports 101-5, 101-6 . . . for the communication ports provided in the side wall 100sw2.

Further, FIGS. 14A and 14B represent the movable buffer 110 provided near the side wall 100sw1 (see, e.g., FIG. 13A) as a movable buffer 110-1, and the movable buffer 110 provided near the side wall 100sw2 as a movable buffer 110-2. In the same manner, FIGS. 14A and 14B represent the track 120 as tracks 120-1 and 120-2. Since FIG. 14B represents the perspective view of the configuration illustrated in FIG. 14A for facilitating the understanding of the configuration, the transfer chamber 100 will be described below using FIG. 14A.

As illustrated in FIG. 14A, in the movable buffer 110-1, the bent portion 111b (see, e.g., FIG. 13A) projects rightward (e.g., in the positive direction of the X axis) when viewed from the robot 10, as in the movable buffer 110 illustrated in FIG. 13A. Thus, the movable buffer 110-1 moves rightward (e.g., in the positive direction of the X axis) so as to avoid the robot 10 in a posture in which the hand 13 holding the substrate W is brought close to the movable buffer 110. That is, as illustrated in FIG. 14A, when the movable buffer 110-1 is positioned in front of the communication port 101-1, the movable buffer 110-1 moves in the positive direction of the X-axis so as to avoid the robot 10-1.

Accordingly, one end of the track 120-1 (e.g., in the negative direction of the X axis) is not required to extend toward the communication port 101-9. In contrast, when the movable buffer 110-1 is positioned in front of the communication port 101-4, the movable buffer 110-1 needs to avoid the robot 10-4 in the positive direction of the X-axis, and hence, the other end of the track 120-1 (e.g., in the positive direction of the X axis) needs to be provided to extend in the positive direction of the X axis as illustrated in FIG. 14A.

Meanwhile, in the movable buffer 110-2, the bent portion 111b (see, e.g., FIG. 13A) projects leftward when viewed from the robot 10, unlike the movable buffer 110 illustrated in FIG. 13A. Thus, the movable buffer 110-2 moves leftward so as to avoid the robot 10 in a posture in which the hand 13 holding the substrate W is brought close to the movable buffer 110. The movable buffer 110-1 is provided to be symmetric with the movable buffer 110-2 with respect to the line parallel to the X axis.

Thus, as illustrated in FIG. 14A, when the movable buffer 110-2 is positioned in front of the communication port 101-5, the movable buffer 110-2 may move in the positive direction of the X axis so as to avoid the robot 10, similar to the movable buffer 110-1. Accordingly, one end of the track 120-2 (e.g., in the negative direction of the X axis) is not required to extend toward the communication port 101-10. On the contrary, when the movable buffer 110-2 is positioned in front of the communication port 101-8, the movable buffer 110-2 needs to avoid the robot 10-4 in the positive direction of the X axis, and hence, the other end of the track 120-2 (e.g., in the positive direction of the X axis) needs to be provided to extend in the positive direction of the X axis as illustrated in FIG. 14A.

Next, an example of the operations of the robot 10 and the movable buffer 110 illustrated in FIG. 14A will be described. It is assumed that a processed substrate W exists in the processing chamber PC (see, e.g., FIG. 3) that communicates with the communication port 101-1, the robot 10 is not holding a substrate W, an unprocessed substrate W is placed on the second stage (e.g., the upper stage) of the movable buffer 110, and no substrate W exists on the first stage (e.g., the lower stage).

In this case, the movable buffer 110-1 stands by at a position deviated from the robot 10-1 in the positive direction of the X axis relative to the position illustrated in FIG. 14A, that is, in the vicinity of the robot 10-1. The robot 10-1 passes the hand 13 through the communication port 101-1 to take the processed substrate W out of the processing chamber PC. Then, the robot 10-1 moves the hand 13 up or down while retreating the hand 13, to the position where the substrate W may be transferred to the first stage of the movable buffer 110-1. The movable buffer 110-1 moves from the standby position to the vicinity of the robot 10-1, and stops at the position where the hand 13 holding the processed substrate W enters between the first stage and the second stage, in the X-axis direction.

The robot 10-1 moves the hand 13 forward. Then, the robot 10-1 moves the hand 13 down until the substrate W is placed on the first stage of the movable buffer 110-1. The movable buffer 110-1 that has received the substrate W moves away from the robot 10-1 again, and moves to the standby position. The robot 10-1 retreats the hand 13 while moving the hand 13 upward to the height at which the hand 13 enters between the first stage and the second stage of the movable buffer 110-1. The movable buffer 110-1 moves from the standby position to the vicinity of the robot 10-1, and stops at the position where the hand 13 that is not holding the substrate W enters between the first and second stages, in the X-axis direction.

The robot 10-1 moves the hand 13 forward. Then, the robot 10-1 moves the hand 13 up until the hand 13 acquires the unprocessed substrate W placed on the second stage of the movable buffer 110-1. The movable buffer 110-1 moves away from the robot 10-1 again, and moves to the standby position. Then, the robot 10-1 that has acquired the unprocessed substrate W moves the hand 13 forward, so as to carry the substrate W into the processing chamber PC. In this way, the robot 10 and the movable buffer 110 operate in cooperation with each other, in order not to interfere with the substrates W or the like held by the robot 10 and the movable buffer 110.

While FIG. 14A illustrates two tracks 120 (e.g., the tracks 120-1 and 120-2), only either one track may be provided. For example, when only the track 120-1 is provided, each robot 10 transfers the substrate W in cooperation with the movable buffer 110-1. For example, the robot 10-4 accesses the processing chambers PC that communicate with the communication ports 101-4 and 101-8, respectively, in cooperation with the movable buffer 110-1.

Figure 15:
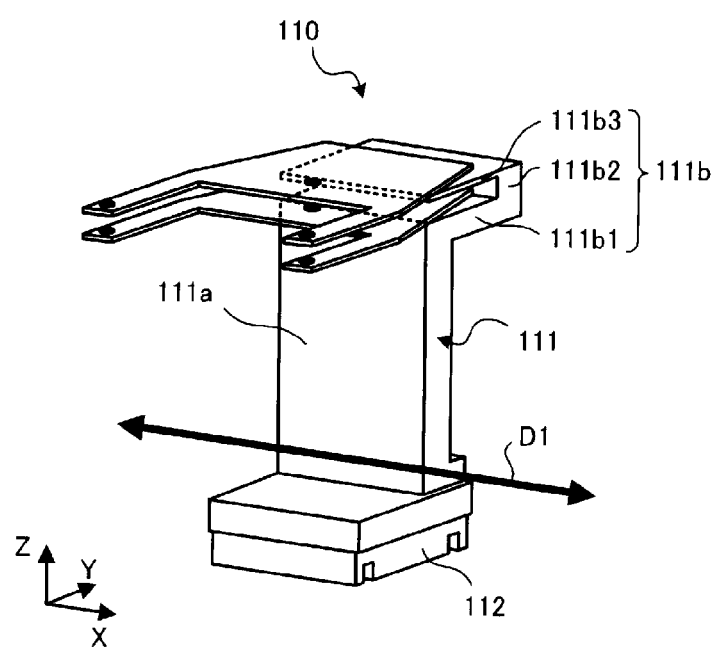
FIG. 15 is a view illustrating a modification of the multi-stage movable buffer.

Next, a modification of the movable buffer 110 illustrated in FIG. 13A will be described using FIG. 15. FIG. 15 is a view illustrating a modification of the multi-stage movable buffer 110. In the following descriptions, differences from the movable buffer 110 illustrated in FIG. 13A will be mainly described, and overlapping descriptions will be appropriately omitted.

The movable buffer 110 illustrated in FIG. 15 is different from the movable buffer 110 illustrated in FIG. 13A in that the bent portion 111b is bent in a different direction from that in the movable buffer 110 of FIG. 13A. As illustrated in FIG. 15, in the bent portion 111b, the projecting portion 111b1 projects from the support 111a in the positive direction of the Y axis such that the upper surface of the projecting portion 111b1 and the upper surface of the support 111a are flush with each other. The support column 111b2 bent upward from the projecting portion 111b1 is positioned on the side of the positive direction of the Y axis. Further, the folded-back portion 111b3 is bent in the negative direction of the Y axis.

When the movable buffer 110 illustrated in FIG. 15 is used in place of the movable buffer 110 illustrated in FIG. 13A, the support column 111b2 does not cause any interference, so that the movable buffer 110 may avoid the robot 10 or the substrate W by moving in any side of the horizontal direction D1. Accordingly, the other end of the track 120 illustrated in FIG. 14A (e.g., in the positive direction of the X axis) may not be provided to extend in the positive direction of the X axis as illustrated in FIG. 14A. Thus, the entire length of the track 120 may be reduced, so that the volume of the transfer chamber 100 may be reduced.

Further, when the movable buffer 110 illustrated in FIG. 15 is used, the width of the transfer chamber 100 (e.g., the width along the Y axis) is larger than that when the movable buffer 110 illustrated in FIG. 13A is used. Accordingly, when it is desired to reduce the width of the transfer chamber 100, the movable buffer 110 illustrated in FIG. 13A may be used.

As described above, the transfer system 1 according to the embodiment includes the transfer chamber 100 in which the plurality of processing chambers PC are provided on the side wall 100sw to each perform a processing on the substrate W in a decompressed atmosphere, and the substrate W is transferred under the decompressed atmosphere. The transfer chamber 100 includes the plurality of robots 10 fixed in the transfer chamber 100 and configured to each transfer the substrate W, and the movable buffer 110. The movable buffer 110 holds the substrate W, and moves in the horizontal direction along the side wall 100sw between the side wall 100sw and the robots 10. Each robot 10 transfers the substrate W between the movable buffer 110 and a processing chamber PC in cooperation with the movement of the movable buffer 110.

In the transfer system, the robot is fixed, and the buffer where the substrate is placed is movable, such that the substrate is transferred by the cooperate operation of the robot and the movable buffer, and as a result, the weight of the moving subject may be reduced. Accordingly, the moving mechanism may be simplified, and the operating rate of the moving mechanism may be improved, so that the availability for the transfer of the substrate may be improved. Accordingly, it becomes possible to improve the transfer efficiency of the substrate.

According to an aspect of an embodiment, it is possible to provide a transfer system, a transfer method, and a transfer apparatus which are capable of improving the transfer efficiency of a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A transfer system comprising:
a transfer chamber having a side wall provided thereon with a plurality of processing chambers in which substrates are processed under a decompressed atmosphere, and configured such that the substrates are transferred under the decompressed atmosphere;
a load lock chamber provided on the side wall of the transfer chamber and configured to change an internal pressure between the decompressed atmosphere and an atmospheric pressure atmosphere;
a plurality of robots fixed in the transfer chamber and configured to transfer the substrates; and
a movable buffer configured to hold the substrates, and move the substrates in a horizontal direction along the side wall between the side wall and the plurality of robots in the transfer chamber,
wherein at least one of the plurality of robots exchanges the substrates between the movable buffer and the processing chambers or between the movable buffer and the load lock chamber, the at least one of the plurality of robots and the movable buffer are positioned at a height such that the at least one of the plurality of robots directly transfers the substrates to and from the movable buffer,
the plurality of robots include a first robot with four or more degrees of freedom which include one degree of freedom in a vertical direction and three or more degrees of freedom in the horizontal direction, and
the first robot accesses the load lock chamber and one of the plurality of processing chambers, or accesses the plurality of processing chambers adjacent with each other on the side wall.

2. The transfer system according to claim 1, wherein the movable buffer is configured to be able to stop in front of the side wall when viewed from the plurality of robots.

3. The transfer system according to claim 1, wherein the transfer chamber includes a track fixed therein,
the movable buffer includes a substrate holder configured to hold the substrates, and a driver that corresponds to a mover of a linear motor, and
the driver is driven in a non-contact manner by a stator included in the track.

4. The transfer system according to claim 3, wherein the substrate holder includes a sub-holder configured to hold the substrates in two stages of an upper stage and a lower stage.

5. The transfer system according to claim 3, wherein the side wall is linear type when viewed from above, and is provided thereon with the plurality of processing chambers arranged in the horizontal direction,
the plurality of robots are provided along an arrangement direction of the processing chambers, and the track is fixed at a position close to the side wall relative to the plurality of robots, and is a linear track along the arrangement direction.

6. The transfer system according to claim 5, wherein the linear track includes a curved portion that is curved in a direction away from the side wall, at either one of both ends thereof.

7. The transfer system according to claim 5, wherein the transfer chamber has a rectangular shape when viewed from above, and includes
a first side wall and a second side wall that correspond to relatively long sides of the rectangular shape,
a first linear track that is the linear track provided between the first side wall and the plurality of robots, and
a second linear track that is the linear track provided between the second side wall and the plurality of robots.

8. The transfer system according to claim 7, wherein the transfer chamber includes a first curved track that connects one of side ends of the first linear track and the second linear track to each other.

9. The transfer system according to claim 8, wherein the transfer chamber includes a second curved track that connects the other one of side ends of the first linear track and the second linear track to each other.

10. The transfer system according to claim 3, wherein a plurality of movable buffers is provided for the track, and each of the plurality of movable buffers is movable independently from each other.

11. The transfer system according to claim 3, wherein a plurality of movable buffers is provided for the track, and each of the plurality of movable buffers is connected to each other.

12. The transfer system according to claim 3, wherein the movable buffer includes two substrate holders and one driver, and
the two substrate holders are connected to both ends of the driver in the horizontal direction, respectively.

13. The transfer system according to claim 1, wherein the plurality of robots include a second robot with three degrees of freedom which include one degree of freedom in the vertical direction and two degrees of freedom in the horizontal direction, and
the second robot is disposed in front of one of the processing chambers.

14. The transfer system according to claim 13, wherein each of the plurality of robots is provided with a hand in which two forks each configured to hold a substrate are connected back to back.

15. The transfer system according to claim 1, wherein the plurality of robots include a third robot provided with a dual arm that each has two degrees of freedom in the horizontal direction, and having one degree of freedom in the vertical direction, and
the third robot is disposed at a position closest to the load lock chamber, among the plurality of robots.

16. The transfer system according to claim 1, wherein the plurality of robots include a fourth robot with two degrees of freedom in the horizontal direction, and
the movable buffer includes a lifter configured to move the substrate in an up and down direction.

17. A transfer method comprising:
providing a transfer system including
a transfer chamber having a side wall provided thereon with a plurality of processing chambers in which substrates are processed under a decompressed atmosphere, and configured such that the substrates are transferred under the decompressed atmosphere,
a load lock chamber provided on the side wall of the transfer chamber and configured to change an internal pressure between the decompressed atmosphere and an atmospheric pressure atmosphere,
a plurality of robots fixed in the transfer chamber and configured to transfer the substrates, and
a movable buffer configured to hold the substrates, and move the substrates in a horizontal direction along the side wall between the side wall and the plurality of robots in the transfer chamber;
providing a first robot among the plurality of robots such that the first robot has four or more degrees of freedom which include one degree of freedom in a vertical direction and three or more degree of freedom in the horizontal direction;
allowing the first robot to access the load lock chamber and one of the plurality of processing chambers, or access the plurality of processing chambers adjacent with other on the side wall; and
operating at least one of the plurality of robots and the movable buffer in cooperation with each other, to exchange the substrates between the movable buffer and the processing chambers or between the movable buffer and the load lock chamber, the at least one of the plurality of robots and the movable buffer are positioned at a height such that the at least one of the plurality of robots directly transfers the substrates to and from the movable buffer.

18. A transfer apparatus comprising:
a plurality of robots fixed in a transfer chamber and configured to transfer substrates, the transfer chamber having a side wall provided thereon with a plurality of processing chambers in which the substrates are processed under a decompressed atmosphere, and configured such that the substrates are transferred under the decompressed atmosphere;
a load lock chamber provided on the side wall of the transfer chamber and configured to change an internal pressure between the decompressed atmosphere and an atmospheric pressure atmosphere;
a movable buffer configured to hold the substrates, and move the substrates in a horizontal direction along the side wall between the side wall and the plurality of robots in the transfer chamber; and
a controller configured to operate the plurality of robots and the movable buffer in cooperation with each other such that at least one of the plurality of robots exchanges the substrates between the movable buffer and the processing chambers, or between the movable buffer and the load lock chamber, the at least one of the plurality of robots and the movable buffer are positioned at a height such that the at least one of the plurality of robots directly transfers the substrates to and from the movable buffer,
wherein the plurality of robots include a first robot with four or more degrees of freedom which include one degree of freedom in a vertical direction and three or more degrees of freedom in the horizontal direction, and
the first robot accesses the load lock chamber and one of the plurality of processing chambers, or accesses the plurality of processing chambers, or accesses the plurality of processing chambers adjacent with each other on the side wall.

* * * * *